(12) United States Patent
Zhao et al.

(10) Patent No.: US 11,355,556 B2
(45) Date of Patent: *Jun. 7, 2022

(54) DISPLAY PANEL

(71) Applicant: WUHAN CHINA STAR OPTOLECTRONICS SEMICONDUCTOR DISPLAY TECHNOLOGY CO., LTD., Wuhan (CN)

(72) Inventors: Yong Zhao, Hubei (CN); Liang Sun, Hubei (CN); Haokai Li, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/941,881

(22) Filed: Jul. 29, 2020

(65) Prior Publication Data

US 2020/0403044 A1 Dec. 24, 2020

Related U.S. Application Data

(63) Continuation-in-part of application No. PCT/CN2019/116094, filed on Nov. 6, 2019, and a
(Continued)

(30) Foreign Application Priority Data

Feb. 1, 2018 (CN) .......................... 201810103217.3
Jan. 31, 2019 (CN) .......................... 201910100351.2

(51) Int. Cl.
H01L 27/32 (2006.01)

(52) U.S. Cl.
CPC ...... *H01L 27/3216* (2013.01); *H01L 27/3218* (2013.01)

(58) Field of Classification Search
CPC .......................................... H01L 27/3206–3218
See application file for complete search history.

(56) References Cited

U.S. PATENT DOCUMENTS 10,971,054 B2 * 4/2021 Zhao .................... G09G 3/2003
2017/0179160 A1 * 6/2017 Takahashi ............ G09G 3/2092
(Continued)

FOREIGN PATENT DOCUMENTS

CN 103311266 A 9/2013
CN 104282727 A 1/2015
(Continued)

*Primary Examiner* — Eric K Ashbahian
(74) *Attorney, Agent, or Firm* — Hamre, Schumann, Mueller & Larson, P.C.

(57) ABSTRACT

A display panel includes a pixel arrangement structure. The pixel arrangement structure includes a plurality of first pixel rows and a plurality of second pixel rows arranged alternately. Each of the first pixel rows comprises a plurality of first pixels arranged at intervals, and each of the second pixel rows comprises a plurality of second pixels and a plurality of third pixels arranged alternately and at intervals. A shape of the first pixel comprises a shape formed by an arc. Each of the second pixel and the third pixel comprises a plurality of concave arcs and a plurality of convex arcs, the plurality of concave arcs and the plurality of convex arcs of the second pixel are alternately connected and form a closed figure, and the plurality of concave arcs and the plurality of convex arcs of the third pixel are alternately connected and form a closed figure.

19 Claims, 25 Drawing Sheets

Related U.S. Application Data continuation-in-part of application No. PCT/CN2018/077253, filed on Feb. 26, 2018.

(56) References Cited

U.S. PATENT DOCUMENTS

| | | | | |
|---|---|---|---|---|
| 2019/0355794 A1* | 11/2019 | Dai | ............... | H01L 27/3218 |
| 2020/0357861 A1* | 11/2020 | Wang | ............ | H01L 27/3216 |
| 2020/0357866 A1* | 11/2020 | Zhao | ............ | H01L 27/3218 |
| 2020/0411602 A1* | 12/2020 | Zhao | ............ | H01L 27/326 |

FOREIGN PATENT DOCUMENTS

| | | | | |
|---|---|---|---|---|
| CN | 104576699 | A | 4/2015 | |
| CN | 204885166 | U | 12/2015 | |
| CN | 106298855 | A | 1/2017 | |
| CN | 106816449 | * | 6/2017 | ......... H01l 27/3216 |
| CN | 106816449 | A | 6/2017 | |
| CN | 109817682 | A | 5/2019 | |

\* cited by examiner

DISPLAY PANEL

CROSS REFERENCE

This application is a continuation-in-part application of PCT/CN2019/116094, filed Nov. 6, 2019, which claims priority to Chinese Patent Application No. 201910100351.2 filed on Jan. 31, 2019 and also a continuation-in-part of PCT/CN2018/077253 filed on Feb. 26, 2018, which claims priority to Chinese Patent Application No. 201810103217.3 filed on Feb. 1, 2018, all of which are herein incorporated by reference in their entirety for all purposes.

FIELD OF INVENTION

The present disclosure relates to the field of display technologies, and more particularly to a display panel.

BACKGROUND OF INVENTION

Luminescent material layers of pixels in conventional organic light emitting diode (OLED) display panels are generally formed by evaporation processes. In the process of forming the luminescent material layers of the pixels, a certain gap should be reserved between the luminescent material layers of two adjacent pixels to prevent luminescent materials of different pixels from interfering with each other.

Due to limitation of a shape of the pixels and the gap between the pixels, unused space between the pixels in the conventional OLED display panel is relatively large, so an aperture ratio of the pixels in the conventional OLED display panel is relatively low.

Therefore, it is necessary to propose a new technical solution to solve the above technical issues.

SUMMARY OF INVENTION

An object of the present disclosure is to provide a display panel capable of preventing color drift from being over a predetermined range and effectively increasing a pixel aperture ratio.

In order to solve the above issues, a technical solution of an embodiment of the present disclosure is as follows.

A pixel arrangement structure includes a plurality of first pixel rows and a plurality of second pixel rows arranged alternately. Each of the first pixel rows comprises a plurality of first pixels arranged at intervals, and each of the second pixel rows comprises a plurality of second pixels and a plurality of third pixels arranged alternately and at intervals. A shape of the first pixel comprises a shape formed by an arc. Each of the second pixel and the third pixel comprises a plurality of concave arcs and a plurality of convex arcs, the plurality of concave arcs and the plurality of convex arcs of the second pixel are alternately connected and form a closed figure, and the plurality of concave arcs and the plurality of convex arcs of the third pixel are alternately connected and form a closed figure.

In the pixel arrangement structure, the first pixel, the second pixel, and the third pixel have different colors.

In the pixel arrangement structure, the plurality of concave arcs of the second pixel have the same radius of curvature, and/or the plurality of concave arcs of the third pixel have the same radius of curvature.

In the pixel arrangement structure, the plurality of convex arcs of the second pixel have the same radius of curvature, and/or the plurality of convex arcs of the third pixel have the same radius of curvature.

In the pixel arrangement structure, a radius of curvature of the plurality of concave arcs of the third pixel is equal to a radius of curvature of the plurality of convex arcs of the third pixel, and/or a radius of curvature of the plurality of concave arcs of the second pixel is equal to a radius of curvature of the plurality of concave arcs of the second pixel.

In the pixel arrangement structure, the plurality of concave arcs of each of the third pixels are respectively opposite to the four first pixels adjacent to the third pixel, and the plurality of concave arcs of each of the second pixels are respectively opposite to the four first pixels adjacent to the second pixel; or the plurality of convex arcs of each of the third pixels are respectively opposite to the four first pixels adjacent to the third pixel, and the plurality of convex arcs of each of the second pixels are respectively opposite to the four first pixels adjacent to the second pixel.

In the pixel arrangement structure, a pixel density of the pixel arrangement structure ranges from 200 ppi to 600 ppi.

In the pixel arrangement structure, a distance from the plurality of concave arcs of the third pixel to an edge of the first pixel opposite to the plurality of concave arcs of the third pixel and a distance from the plurality of concave arcs of the second pixel to an edge of the first pixel opposite to the plurality of concave arcs of the second pixel are both a first length, a distance from a center of the third pixel to the plurality of concave arcs of the third pixel and a distance from a center of the second pixel to the plurality of concave arcs of the second pixel are both a second length, and a radius of the smallest circumscribed circle of the first pixel is a third length; the first length ranges from 10 um to 30 um, the second length ranges from 10 um to 50 um, and the third length ranges from 4 um to 40 um.

In the pixel arrangement structure, a center of the first pixel coincides with an end point of a radius of curvature of the plurality of concave arcs of the third pixel, and/or a center of the first pixel coincides with an end point of a radius of curvature of the plurality of concave arcs of the second pixel.

In the pixel arrangement structure, a center of the first pixel coincides with a center of a circle corresponding to the plurality of concave arcs of the third pixel, and/or a center of the first pixel coincides with a center of a circle corresponding to the plurality of concave arcs of the second pixel.

In the pixel arrangement structure, the shape of the first pixel is an ellipse.

In the pixel arrangement structure, the second pixel comprises four concave arcs and four convex arcs, which are alternately connected and form a closed figure, and the third pixel comprises four concave arcs and four convex arcs, which are alternately connected and form a closed figure.

In the pixel arrangement structure, the second pixels and the third pixels are alternately arranged in at least one of a first direction, a second direction, a third direction, and a fourth direction, the first direction is perpendicular to the second direction, the third direction is a direction having an angle of less than 90 degrees with the first direction, and the fourth direction is perpendicular to the third direction.

In the pixel arrangement structure, a shape of an edge of one of the second pixels and the third pixels in the third direction or the fourth direction comprises a concave arc, a sum of a radius of curvature of a shape of an edge of the first pixels facing one of the second pixels and the third pixels and a width of a predetermined gap is equal to a radius of curvature of the concave arc included in the edge of one of the second pixels and the third pixels in the third direction or the fourth direction.

In the pixel arrangement structure, the predetermined gap is a gap between an edge of one of the second pixels and the third pixels and an edge of each adjacent first pixel in one of the third direction and the fourth direction.

In the pixel arrangement structure, a width of the predetermined gap in the third direction is equal to a width of the predetermined gap in the fourth direction.

In the pixel arrangement structure, an arc and an extended arc thereof corresponding to an edge of third pixel facing the first pixel and an arc and an extended arc thereof corresponding to an edge of the second pixel facing the first pixel form a predetermined shape, and the predetermined shape comprises a circle or an ellipse.

In the pixel arrangement structure, a center of a shape of the first pixels is the same as a center of the predetermined shape.

In the pixel arrangement structure, a radius of curvature of one of the plurality of concave arcs of the third pixel is greater than a radius of curvature of another of the plurality of concave arcs of the third pixel; or a radius of curvature of one of the plurality of concave arcs of the third pixel is greater than or equal to a radius of curvature of one of the plurality of concave arcs of the second pixel.

A display panel includes the above pixel arrangement structure.

Beneficial effects of the present invention: the present invention provides a pixel arrangement structure and a display panel includes the pixel arrangement structure. The pixel arrangement structure includes a plurality of first pixel rows and a plurality of second pixel rows arranged alternately. Each of the first pixel rows comprises a plurality of first pixels arranged at intervals, and each of the second pixel rows comprises a plurality of second pixels and a plurality of third pixels arranged alternately and at intervals. A shape of the first pixel comprises a shape formed by an arc. Each of the second pixel and the third pixel comprises a plurality of concave arcs and a plurality of convex arcs, the plurality of concave arcs and the plurality of convex arcs of the second pixel are alternately connected and form a closed figure, and the plurality of concave arcs and the plurality of convex arcs of the third pixel are alternately connected and form a closed figure. This can prevent color drift from being over a predetermined range and effectively increase a pixel aperture ratio.

DESCRIPTION OF DRAWINGS

In order to further understand features and technical content of the present invention, refer to the following detailed description and drawings of the present invention. However, the drawings are provided for reference and explanation only, and are not intended to limit the present invention.

DETAILED DESCRIPTION OF PREFERRED EMBODIMENTS

The term "edge" as used in this specification means an outer or a furthest point of something. For example, an edge can be a margin, an outer part, or a periphery. In details, in an ellipse, a line that passes through two focal points and ends on the ellipse is called a long axis. The long axis is the longest line that can be obtained by connecting two points on the ellipse. A line that passes through a center (a midpoint of a line between two focal points) perpendicular to the long axis and ends at the ellipse is called a short axis. A semi-major axis is half of a major axis, that is a line from a center through a focal point to an edge of the ellipse. Similarly, a semi-minor axis is half of a minor axis.

In order to further elaborate on the technical means and effects adopted by the present invention, the following will describe in detail with reference to the preferred embodiments and the accompanying drawings of the present invention.

The present invention provides a pixel arrangement structure, which is mainly applicable in an organic light emitting diode (OLED) display panel to reduce difficulty of manufacturing the OLED display panel and extend lifetime of the OLED display panel.

The term "embodiment" as used in this specification means an embodiment, an example, or an illustration. In addition, the article "a" as used in the specification and the appended claims may be construed as "one or more." The singular form can be clearly defined unless otherwise specified or from the context.

Any two of a first embodiment, a second embodiment, a third embodiment, and a fourth embodiment of a display panel 100 of the present disclosure are similar or same.

In the first embodiment, the second embodiment, the third embodiment, and the fourth embodiment of the present disclosure, the display panel 100 can be, for example, an organic light emitting diode (OLED) panel or the like.

The display panel includes at least two pixel repeating units, and the at least two pixel repeating units are arranged in an array (one-dimensional array or two-dimensional array). The pixel repeating unit includes one first pixel 101, one second pixel 102, one third pixel 103, and another one of the first pixel 101, the second pixel 102, and the third pixel 103.

Figure 1:
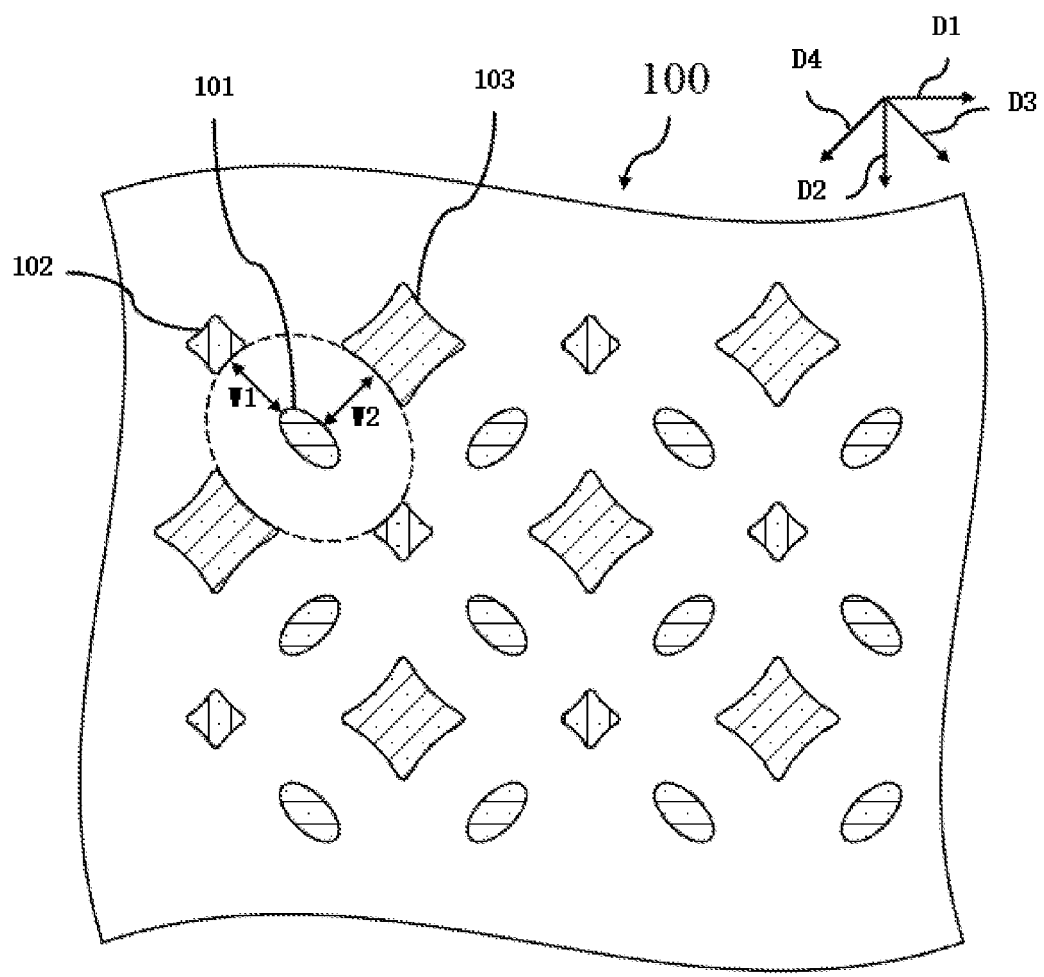
FIG. 1 is a schematic view of a display panel according to a first embodiment of the present disclosure.
Figure 2:
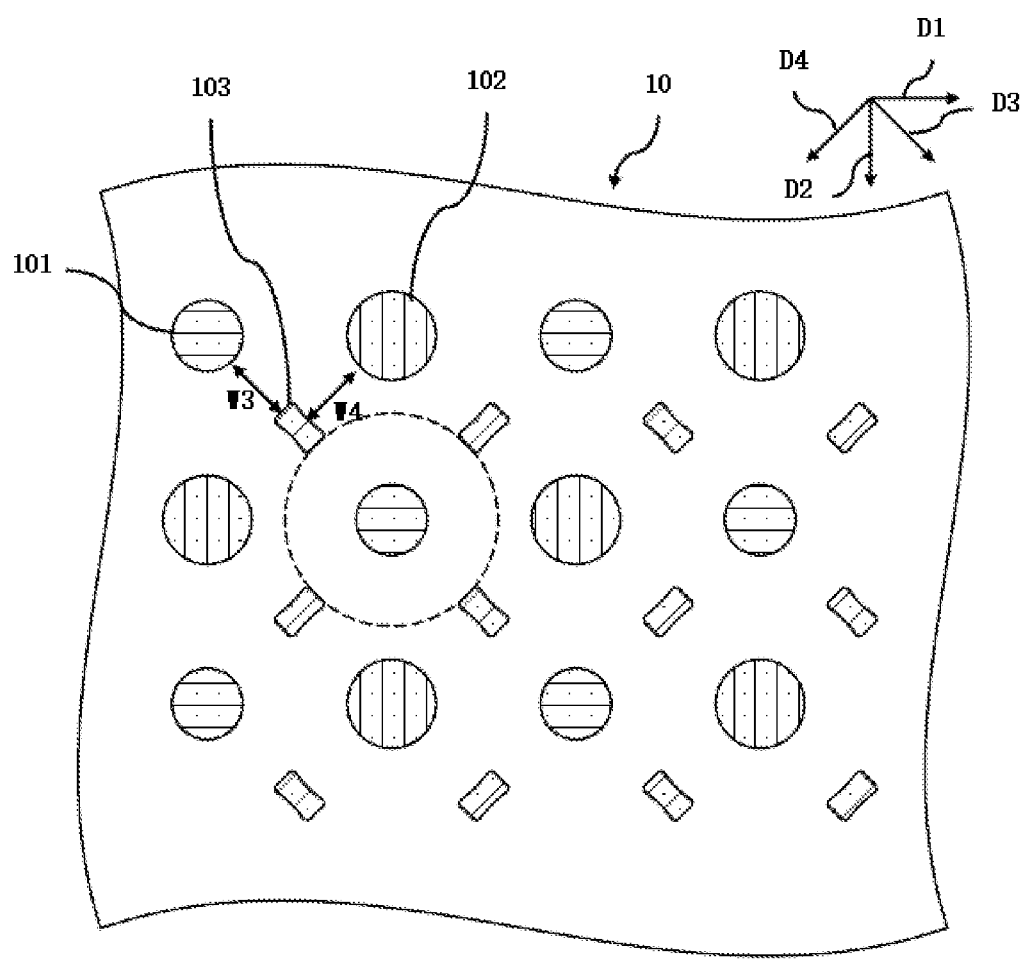
FIG. 2 is a schematic view of a display panel according to a second embodiment of the present disclosure.
Figure 3:
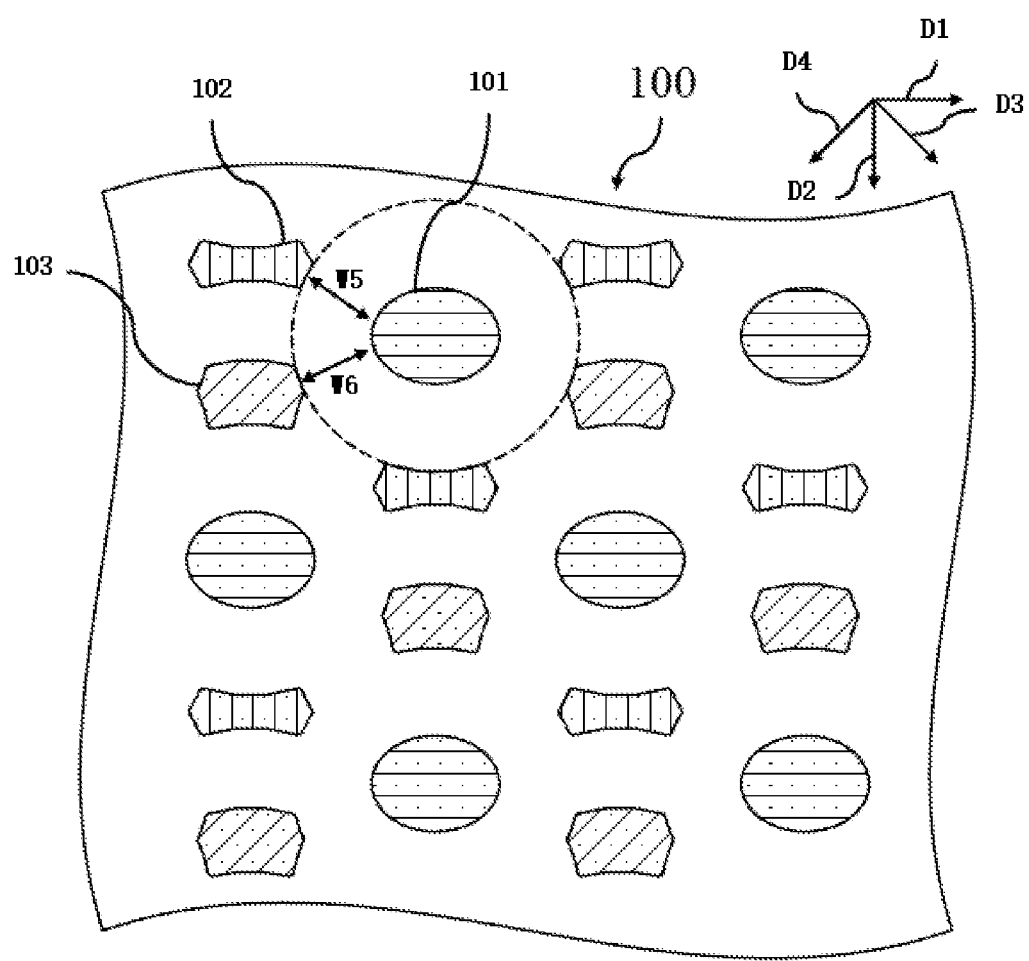
FIG. 3 is a schematic view of a display panel according to a third embodiment of the present disclosure.
Figure 4:
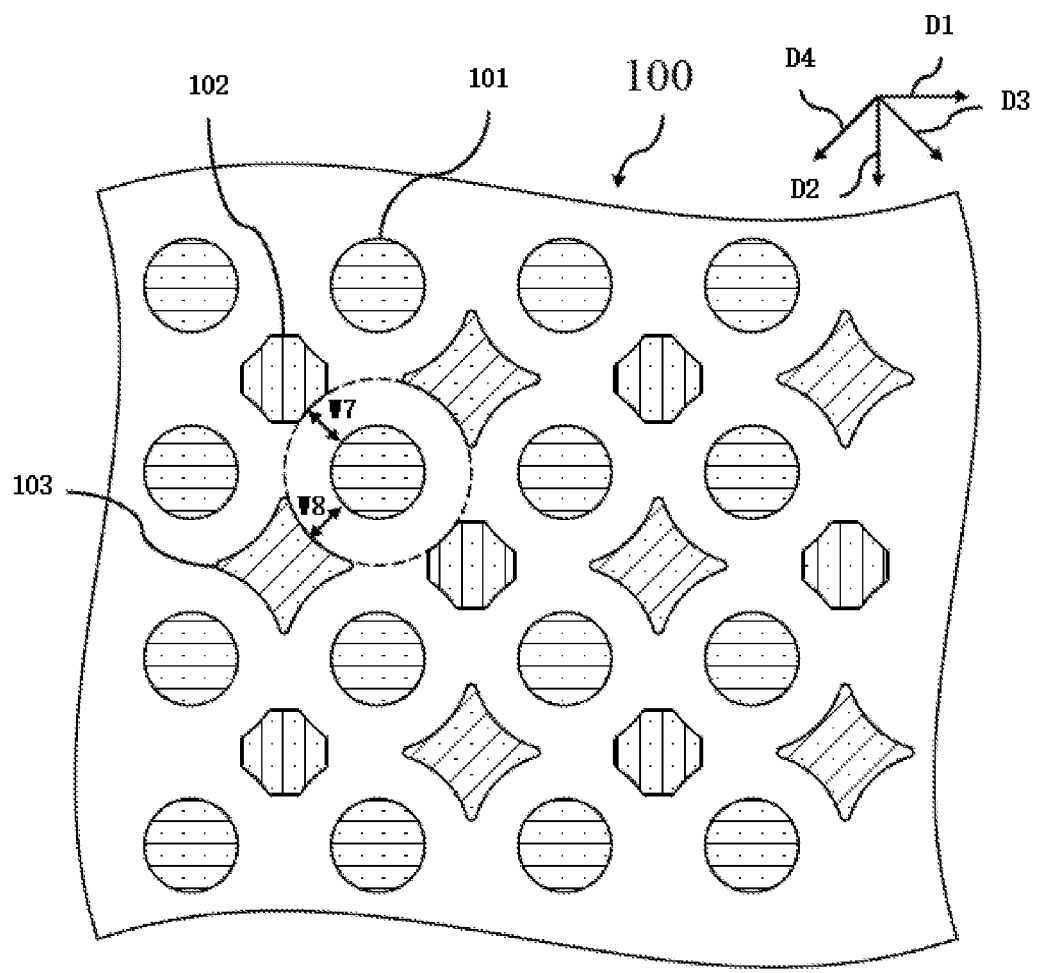
FIG. 4 is a schematic view of a display panel according to a fourth embodiment of the present disclosure.

For example, the pixel repeating unit includes one first pixel 101, one second pixel 102, and one third pixel 103, as shown in FIG. 3. Or the pixel repeating unit includes two first pixels 101, one second pixel 102, one third pixel 103, as shown in FIG. 1 and FIG. 4. Or, the pixel repeating unit includes one first pixel 101, two second pixels 102, and two third pixels 103. Or, the pixel repeating unit includes one first pixel 101, one second pixel 102, and two third pixels 103 as shown in FIG. 2.

The first pixel 101, the second pixel 102, and the third pixel 103 are ones of different red, green, and blue pixels.

The shapes of the first pixel 101, the second pixel 102, and the third pixel 103 are formed (connected) by a convex arc and/or a concave arc.

Specifically, a shape of at least one of the first pixel 101, the second pixel 102, and the shape of at most two of the first pixel 101, the second pixel 102, and the third pixel 103 is a shape formed by a convex arc. The shape of the rest of at least two of the first pixel 101, the second pixel 102, and the third pixel 103 is a shape formed by a concave arc. Or, the shape of the rest of at least two of the first pixel 101, the second pixel 102, and the third pixel 103 are formed by a convex arc and a concave arc (two ends of a convex arc are respectively connected to two concave arcs). At least one of the first pixel 101, the second pixel 102, and the third pixel 103 is circular or elliptical, and at most two of the first pixel 101, the second pixel 102, and the third pixel 103 are circular or elliptical.

Shapes of edges of two of the first pixel 101, the second pixel 102, and the third pixel 103 are complementary in one of a first direction D1, a second direction D2, a third direction D3, and a fourth direction D4. The first direction D1 is perpendicular to the second direction D2, the third direction D3 is a direction having an angle of less than 90 degrees with the first direction D1, and the fourth direction D4 is perpendicular to the third direction D3.

The term "complementary" means that two shapes have opposing projections and recesses, and when the two shapes are in contact with each other by moving toward each other, the projections and the recesses of the two shapes are fitted or contained.

For example, as shown in FIG. 1, the first pixel 101 and the second pixel 102 respectively have a protrusion and a recess in the third direction D3, and the first pixel 101 and the second pixel 102 are complementary in the third direction D3. The first pixel 101 and the third pixel 103 respectively have a protrusion and a recess in the fourth direction D4, and the first pixel 101 and the third pixel 103 are complementary in the fourth direction D4.

As shown in FIG. 2, the first pixel 101 and the third pixel 103 respectively have a protrusion and a recess in the third direction D3, and the first pixel 101 and the third pixel 103 are complementary in the third direction D3. The second pixel 102 and the third pixel 103 respectively have a protrusion and a recess in the fourth direction D4, and the second pixel 102 and the third pixel 103 are complementary in the fourth direction D4.

As shown in FIG. 3, the first pixel 101 and second pixel 102 respectively have a protrusion and a recess in the third direction D3, and the first pixel 101 and the second pixel 102 are complementary in the third direction D3. The first pixel 101 and the third pixel 103 respectively have a protrusion and a recess in the fourth direction D4, and the first pixel 101 and the third pixel 103 are complementary in the fourth direction D4. The second pixel 102 and the third pixel 103 respectively have a protrusion and a recess in the second direction D2, and the second pixel 102 and the third pixel 103 are complementary in the second direction D2.

As shown in FIG. 4, the first pixel 101 and second pixel 102 respectively have a protrusion and a recess in the third direction D3, and the first pixel 101 and the second pixel 102 are complementary in the third direction D3. The first pixel 101 and the third pixel 103 respectively have a protrusion and a recess in the fourth direction D4, and the first pixel 101 and the third pixel 103 are complementary in the fourth direction D4.

At least two of each of the first pixels 101, each of the second pixels 102, and each of the third pixels 103 are alternately arranged in at least one of the first direction D1, the second direction D2, the third direction D3, and the fourth direction D4.

Specifically, at least one of the first pixels 101 is located in a range surrounded by at least four of the second pixels 102, and at least one of the first pixels 101 is located in a range surrounded by at least four of the third pixels 103. At least one of the second pixels 102 is located in a range surrounded by at least four of the first pixels 101, and at least one of the second pixels 102 is located in a range surrounded by at least four of the third pixels 103. At least one of the third pixels 103 is located in a range surrounded by at least four of the first pixels 101, and at least one of the third pixels 103 is located in a range surrounded by at least four of the second pixels 102.

As shown in FIG. 1, the second pixel 102 and the third pixel 103 are alternately arranged in the first direction D1 and the second direction D2, and the first pixel 101 and the second pixel 102 are alternately arranged in the third direction D3, the first pixel 101 and the third pixel 103 are alternately arranged in the fourth direction D4.

As shown in FIG. 2, the second pixel 102 and the third pixel 103 are alternately arranged in the first direction D1 and the second direction D2, and the first pixel 101 and the second pixel 102 are alternately arranged in the third direction D3, the first pixel 101 and the third pixel 103 are alternately arranged in the fourth direction D4.

As shown in FIG. 3, the first pixel 101, the second pixel 102, and the third pixel 103 are alternately arranged in the second direction D2, the third direction D3, and the fourth direction D4. The second pixel 102 and the third pixel 103 surround the first pixel 101, and the second pixel 102 and the third pixel 103 are spaced apart.

As shown in FIG. 4, the second pixel 102 and the third pixel 103 are alternately arranged in the first direction D1 and the second direction D2, the first pixel 101 and the second pixel 102 are alternately arranged in the third direction D3, and the first pixel 101 and the third pixel 103 are alternately arranged in the fourth direction D4.

A first gap is formed between the first pixel 101 and the adjacent second pixel 102, a second gap is formed between the second pixel 102 and the adjacent third pixel 103, and a third gap is formed between the third pixel 103 and the adjacent first pixel 101.

At least a portion of the third pixel 103 protrudes toward the first gap, at least a portion of the first pixel 101 protrudes toward the second gap, and at least a portion of the second pixel 102 protrudes toward the third gap.

A width of a gap between two of the first pixel 101, the second pixel 102, and the third pixel 103 alternately arranged in the third direction D3 is same as a width of a gap between two of the first pixel 101, the second pixel 102, and the third pixel 103 alternately arranged in the fourth direction D4.

As shown in FIG. 1, a width W1 of a gap between the first pixel 101 and the second pixel 102 in the third direction D3 is equal to a width W2 of a gap between the first pixel 101 and the third pixel 103 in the fourth direction D4.

As shown in FIG. 2, a width W3 of a gap between the first pixel 101 and the third pixel 103 in the third direction D3 is equal to a width W4 of a gap between the third pixel 103 and the second pixel 102 in the fourth direction D4.

As shown in FIG. 3, a width W5 of a gap between the first pixel 101 and the second pixel 103 in the third direction D3 is equal to a width W6 of a gap between the first pixel 101 and the third pixel 103 in the fourth direction D4.

As shown in FIG. 4, a width W7 of a gap between the first pixel 101 and the second pixel 102 in the third direction D3 is equal to a width W8 of a gap between the first pixel 101 and the third pixel 103 in the fourth direction D4.

The shape of the first pixel 101 is circular or elliptical. The shape of the second pixel 102 is one of shapes formed by a convex arc and/or a concave arc. The shape of the third pixel 103 is a shape formed by a concave arc or a combination of a concave arc and a convex arc. The circular or elliptical shape is one of the shapes formed by the convex arc. It is understood that, the shape formed by the convex arc may include other shapes.

The shape formed by the convex arc and/or the concave arc includes: a shape composed of a convex arc, a shape composed of four-segment concave arc, a shape composed of six-segment concave arc, a shape composed of one-segment convex arc and five-segment concave arc, a shape composed of eight-segment concave arc, a shape composed of four-segment convex arc and four-segment concave arc, a shape composed of six-segment convex arc and six-segment concave arc, a shape composed of seven-segment convex arc and five-segment concave arc, and a shape composed of eight-segment convex arc and eight-segment concave arc.

In the shape composed of four-segment concave arc, the four-segment concave arc is connected end to end.

In the shape composed of six-segment concave arc, the six-segment concave arc is connected end to end.

In the shape composed of one-segment convex arc and five-segment concave arc, the one-segment convex arc and the five-segment concave arc connected end to end.

In the shape composed of eight-segment concave arc, the eight-segment concave arc is connected end to end.

In the shape composed of four-segment convex arc and four-segment concave arc, two ends of the convex arc are respectively connected to two adjacent concave arcs, and two ends of the concave arc are respectively connected to two adjacent convex arcs.

In the shape composed of six-segment convex arc and six-segment concave arc, two ends of the convex arc are respectively connected to two adjacent concave arcs, and two ends of the concave arc are respectively connected to two adjacent convex arcs.

In the shape composed of seven-segment convex arc and five-segment concave arc, the seven-segment convex arc and the five-segment concave arc are connected end to end. The seven-segment convex arc and the five-segment concave arc are connected together at intervals.

In the shape composed of eight-segment convex arc and eight-segment concave arc, two ends of the convex arc are respectively connected to two adjacent concave arcs, and two ends of the concave arc are respectively connected to two adjacent convex arcs.

As shown in FIG. 1, the shape of the first pixel 101 is circular or elliptical, and the shapes of the second pixel 102 and the third pixel 103 are the shapes composed of four-segment convex arc and four-segment concave arc.

As shown in FIG. 2, the shape of the first pixel 101 is circular or elliptical, the shape of the second pixel 102 is circular or elliptical, and the shape of the third pixel 103 is the shape composed of four-segment convex arc and four-segment concave arc.

As shown in FIG. 3, the shape of the first pixel 101 is circular or elliptical, the shape of the second pixel 102 is the shape composed of six-segment convex arc and six-segment concave arc, and the shape of the third pixel 103 is the shape composed of seven-segment convex arc and five-segment concave arc.

As shown in FIG. 4, the shape of the first pixel 101 is circular or elliptical, the shape of the second pixel 102 is the shape composed of eight-segment convex arc and eight-segment concave arc, and the shape of the third pixel 103 is the shape composed of four-segment convex arc and four-segment concave arc.

The shape composed of a convex arc, the shape composed of four-segment concave arc, the shape composed of six-segment concave arc, the shape composed of eight-segment concave arc, the shape composed of four-segment convex arc and four-segment concave arc, the shape composed of six-segment convex arc and six-segment concave arc, and the shape composed of eight-segment convex arc and eight-segment concave arc are centrally symmetrical.

Shapes, sizes, and areas of any two of the first pixel 101, the second pixel 102, and the third pixel 103 are different.

In the above technical solution, the shapes of the first pixel, the second pixel, and the third pixel are shapes formed by a convex arc and/or a concave arc, and shapes of the edges of two of the first pixel, the second pixel and the third pixel are complementary, and therefore, unused space between the pixels in the display panel of the embodiment of the present disclosure can be effectively reduced (improved), and the embodiment of the present disclosure can effectively increase an aperture ratio of a pixel.

In a case where the shape of the first pixel 101 is circular or elliptical, a shape of an edge of one of each of the second pixels 102 and each of the third pixels 103 in the third direction D3 and the fourth direction D4 corresponds to a concave arc, a sum of a radius of curvature of a shape of an edge of each of the first pixels 101 facing one of each of the second pixels 102 and each of the third pixels 103 and a width of a predetermined gap is equal to a radius of curvature of the concave arc corresponding to the edge of one of each of the second pixels 102 and each of the third pixels 103 in the third direction D3 and the fourth direction D4.

The predetermined gap is a gap between an edge of one of each of the second pixels 102 and each of the third pixels 103 and an edge of each adjacent first pixel 101 in one of the third direction D3 and the fourth direction D4. A width of the predetermined gap in the third direction D3 is equal to a width of the predetermined gap in the fourth direction D4.

As shown in FIG. 1, the first pixel 101 has an elliptical shape, and a major axis of the ellipse is parallel to the third direction D3, and a minor axis of the ellipse is parallel to the fourth direction D4. In the third direction D3, the shape of an edge of the second pixel 102 toward the first pixel 101 comprises a concave arc. A radius of curvature of the concave arc of the edge of the second pixel 102 toward the first pixel 101 is equal to a sum of a long axis of the first pixel 101 and a width W1 of the gap between the first pixel 101 and the second pixel 102 in the third direction D3. In the fourth direction D4, the shape of an edge of the third pixel 103 toward the first pixel 101 comprises a concave arc. A radius of curvature of the concave arc of the edge of the third pixel 103 toward the first pixel 101 is equal to a sum of a long axis of the first pixel 101 and a width W2 of the gap between the first pixel 101 and the third pixel 103 in the fourth direction D4.

As shown in FIG. 2, the shape of the first pixel 101 is circular. In the third direction D3, the shape of an edge of the third pixel 103 toward the first pixel 101 comprises to a concave arc. A radius of curvature of the concave of the edge of the first pixel 101 toward the third pixel 103 is equal to a sum of a radius of the first pixel 101 and a width W3 of the gap between the first pixel 101 and the third pixel 103 in the third direction D3. In the fourth direction D4, the shape of an edge of the third pixel 103 toward the first pixel 101 comprises a concave arc. A radius of curvature of the concave arc of the edge of the third pixel 103 toward the first pixel 101 is equal to a width W3 of the gap between the first pixel 101 and the third pixel 103 in the fourth direction D4.

As shown in FIG. 3, the shape of the first pixel 101 is elliptical, the major axis of the ellipse is parallel to the first direction D1, and the minor axis of the ellipse is parallel to the second direction D2. In the third direction D3, the shape of an edge of the second pixel 102 toward the first pixel 101 comprises a concave arc. A radius of curvature of the concave arc of the edge of the second pixel 102 toward the first pixel 101 is equal to a sum of a radius of curvature of the concave arc of to the edge of the second pixel 102 toward the first pixel 101 and a width W5 of the gap between the first pixel 101 and the second pixel 102 in the third direction D3. In the fourth direction D4, the shape of an edge of the third pixel 103 toward the first pixel 101 comprises a concave arc. A radius of curvature of the concave arc of the edge of the third pixel 103 toward the first pixel 101 is equal to a sum of a radius of curvature of the concave arc of the edge of the third pixel 103 toward the first pixel 101 and a width W6 of the gap between the first pixel 101 and the third pixel 103 in the fourth direction D4.

As shown in FIG. 4, the shape of the first pixel 101 is circular. In the third direction D3, the shape of an edge of the second pixel 102 toward the first pixel 101 comprises a concave arc. A radius of curvature of the concave arc of the edge of the second pixel 102 toward the second pixel 102 is equal to a sum of a radius of curvature of the concave arc of the edge of the second pixel 102 toward the first pixel 101 and a width W7 of the gap between the first pixel 101 and the second pixel 102 in the third direction D3. In the fourth direction D4, the shape of an edge of the third pixel 103 toward the first pixel 101 comprises a concave arc. A radius of curvature of the concave arc of the edge of the third pixel 103 toward the first pixel 101 is equal to a sum of a radius of curvature of the concave arc of the edge of the third pixel 103 toward the first pixel 101 and a width W8 of the gap between the first pixel 101 and the third pixel 103 in the fourth direction D4.

An arc and an extended arc thereof corresponding to an edge of third pixel 103 facing the first pixel 101 and an arc and an extended arc thereof corresponding to an edge of the second pixel 102 facing the first pixel 101 form a predetermined shape, and the predetermined shape includes a circle or an ellipse.

As shown in FIG. 1, the predetermined shape is an elliptical shape. As shown in FIG. 2, the predetermined shape is a circular shape. As shown in FIG. 3, the predetermined shape is an elliptical shape. As shown in FIG. 4, the predetermined shape is a circle.

A shape of each of the first pixels 101 is the same as or similar to the predetermined shape.

A center of a shape of each of the first pixels 101 is the same as a center of the predetermined shape.

When the shape of each of the first pixels 101 includes an ellipse, a long axis of the ellipse points to one of each of the second pixels 102 and each of the third pixels 103, a short axis of the ellipse points to the other of each of the second pixels 102 and each of the third pixels 103.

As shown in FIG. 1, the long axis of the ellipse corresponding to the shape of the first pixel 101 is directed to the second pixel 102, and correspondingly, the short axis is directed to the third pixel 103.

As shown in FIG. 3, the short axis of the ellipse corresponding to the shape of the first pixel 101 is directed to the second pixel 102 and the third pixel 103.

An angle between the long axis of the ellipse and the first direction or the second direction ranges between 0 degree and 90 degrees.

As shown in FIG. 1, the angle between the long axis of the ellipse and the first direction D1 is in the range of 40 to 50 degrees. As shown in FIG. 3, the angle between the long axis of the ellipse and the first direction D1 is in a range of 0 to 10 degrees. Correspondingly, the angle between the long axis of the ellipse and the second direction D2 is in the range of 80 degrees to 90 degrees.

When a shape of each of the second pixels 102 includes a circle or an ellipse, and a shape of each of the third pixels 103 includes a concave arc or a combined shape of a concave arc and a convex arc, the shape of each of the third pixels 103 includes a curvature of one of at least four concave arcs that is greater or less than (adjacent) another of the at least four concave arcs.

As shown in FIG. 2, the second pixel 102 has a circular shape, and a radius of curvature of the concave arc corresponding to the edge of the second pixel 102 that the third pixel 103 faces is greater than a radius of curvature of the concave arc corresponding to the edge of the first pixel 101 that the third pixel 103 faces.

When a shape of each of the second pixels 102 and a shape of each of the third pixels 103 both include a concave arc or a combined shape of a concave arc and a convex arc, a curvature of one of at least four concave arcs of the shape of each of the third pixels 103 is greater or equal to a curvature of one of at least four concave arcs of the shape of each of the second pixels 102.

As shown in FIG. 1, a radius of curvature of the concave arc corresponding to the edge of the first pixel 101 that the second pixel 102 faces is greater than a radius of curvature of the concave arc corresponding to the edge of the first pixel 101 that the third pixel 103 faces.

As shown in FIG. 3, a radius of curvature of the convex arc corresponding to the edge of the second pixel 102 that the third pixel 102 faces is greater than a radius of curvature of the convex arc corresponding to the edge of the first pixel 101 that the third pixel 103 faces. A radius of curvature of the convex arc corresponding to the edge of the first pixel 101 that the third pixel 102 faces is equal to a radius of curvature of the convex arc corresponding to the edge of the first pixel 101 that the second pixel 102 faces.

As shown in FIG. 4, a radius of curvature of the convex arc corresponding to the edge of the first pixel 101 that the third pixel 102 faces is equal to a radius of curvature of the convex arc corresponding to the edge of the first pixel 101 that the second pixel 102 faces.

In the above technical solution, since the shape of the first pixel is circular or elliptical, and the shapes of the edges in the second pixel and the third pixel correspond to a concave arc, the sum of the radius of curvature of the shape of the edge of the first pixel and the width of the predetermined gap is equal to the radius of curvature of the concave arc corresponding to the edge of one of the second pixel and the third pixel, and thus, the embodiment of the present disclosure can effectively reduce the unused space between pixels, thereby effectively increasing the aperture ratio of the pixel.

In the above technical solution, since the shape of the first pixel is a circle or an ellipse, the shape of the second pixel is a circle, an ellipse, and a shape formed by a concave arc and a convex arc. In one case, the shape of the third pixel is a shape formed by a concave arc and a convex arc, thereby facilitating the fabrication of the pixel and effectively increasing the aperture ratio of the pixel.

A total area of all of the first pixels 101 (for example, an area of one of the first pixels 101, a sum of areas of the two first pixels 101), all of the total area of the two pixels 102 (for example, an area of one of the second pixels 102, a sum of areas of the two second pixels 102), the total area of all of the third pixels 103 (for example, an area of one of the third pixels 103, a sum of areas of the two third pixels 103) in the pixel repeating unit are inversely proportional to the luminous efficiency of the luminescent material of the first pixel 101, the luminous efficiency of the luminescent material of the second pixel 102, and the luminous efficiency of the luminescent material of the third pixel 103, respectively.

A ratio y1 of an aperture ratio of the red pixel to an aperture ratio of the green pixel is in the range of $0.78e^{(-1.98r)} \leq y1 \leq 2.297e^{(-1.85r)}$, and $0.1 \leq y1 \leq 3$, where r is a ratio of a luminous efficiency of the red pixel to a luminous efficiency of the green pixel, a ratio y2 of an aperture ratio of the blue pixel to the aperture ratio of the green pixel is in a range of $1.32e^{(-10.7b)} \leq y2 \leq 5.95e^{(-14.1b)}$, and $0.3 \leq y2 \leq 4$, where b is a ratio of a luminous efficiency of the blue pixel to the luminous efficiency of the green pixel.

Figure 9:
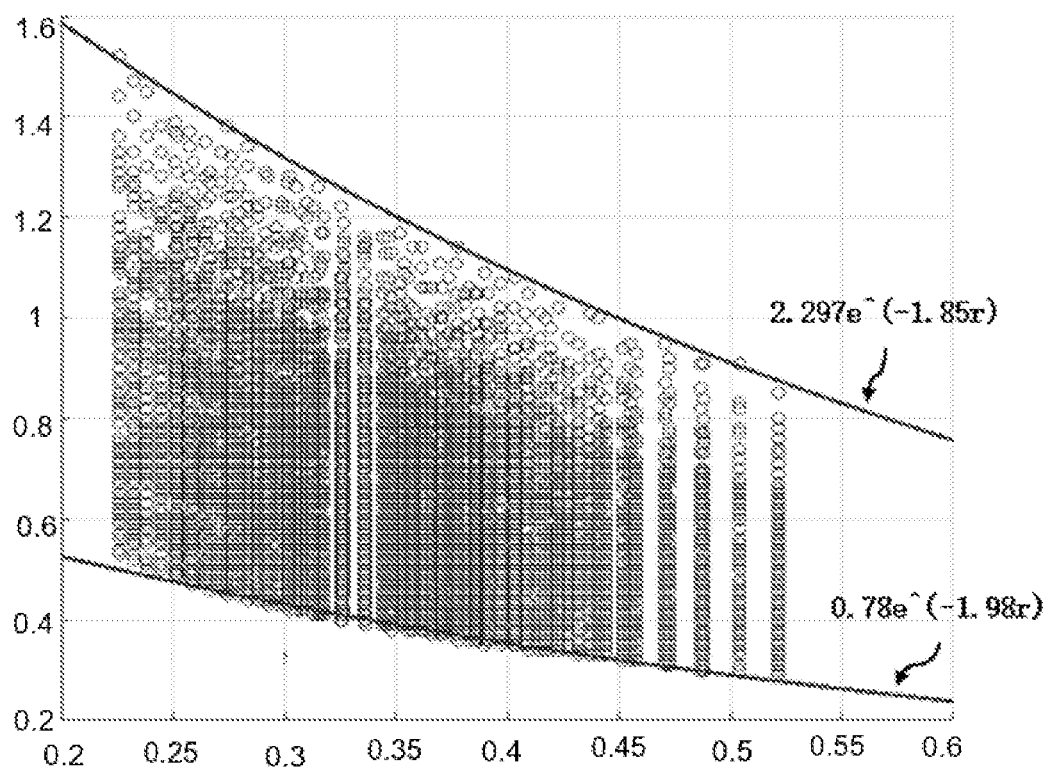
FIG. 9 is a schematic view of simulation data on a relationship between a ratio of an aperture ratio of red pixels to an aperture ratio of green pixels and a ratio of luminous efficiency of the red pixels to luminous efficiency of the green pixels in a display panel according to an embodiment of the present disclosure.
Figure 10:
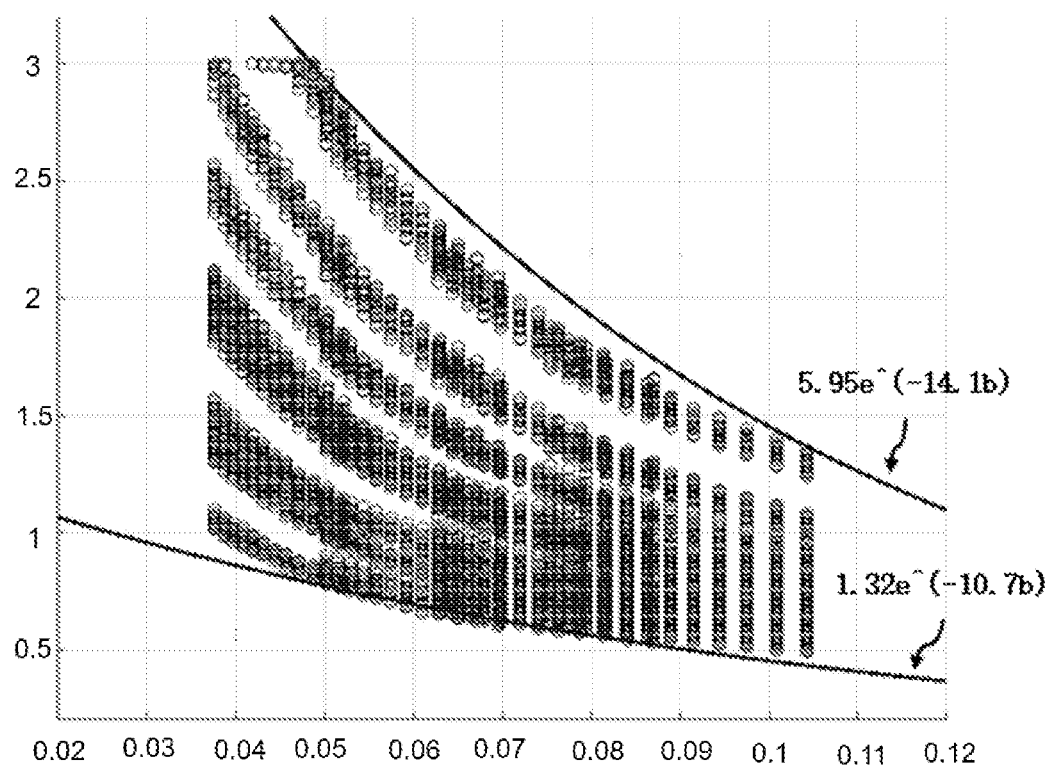
FIG. 10 is a schematic view of simulation data on a relationship between a ratio of an aperture ratio of blue pixels to an aperture ratio of green pixels and a ratio of luminous efficiency of the blue pixels to luminous efficiency of the green pixels in a display panel according to an embodiment of the present disclosure.

The ratio y1 of the aperture ratio of the red pixel to the aperture ratio of the green pixel may be, for example, one of 0.1, 0.2, 0.3, 0.4, 0.5, 0.6, 0.7, 0.8, 0.9, 1, 1.1, 1.2, 1.3, 1.4, 1.5 1.6, 1.7, 1.8, 1.9, 2, 2.1, 2.2, 2.3, 2.4, 2.5, 2.6, 2.7, 2.8, 2.9, and 3. Preferably, the ratio y1 of the aperture ratio of the red pixel to the aperture ratio of the green pixel is in a range of $0.2 \leq y1 \leq 2.2$. The ratio y2 of the aperture ratio of the blue pixel to the aperture ratio of the green pixel may be, for example, one of 0.3, 0.4, 0.5, 0.6, 0.7, 0.8, 0.9, 1, 1.1, 1.2, 1.3, 1.4, 1.5, 1.6, 1.7, 1.8, 1.9, 2, 2.1, 2.2, 2.3, 2.4, 2.5, 2.6, 2.7, 2.8, 2.9, 3, 3.1, 3.2, 3.3, 3.4, 3.5, 3.6, 3.7, 3.8, 3.9, and 4. Preferably, the ratio y2 of the aperture ratio of the blue pixel to the aperture ratio of the green pixel is in the range of $0.5 \leq y2 \leq 3.6$. As shown in FIG. 9 and FIG. 10, in this range, the current densities of various material efficiencies acting on red, green, and blue pixels are equal or substantially equal, while in long-term use, the degree of material attenuation of red, green, and blue pixels are similar, so that the overall color shift of the display panel can fall within a relatively good range.

The aperture ratio and the luminous efficiency of the red pixel, the green pixel, and the blue pixel in the conventional display panel do not have the above relationship (i.e., there is no: $0.78e^{(-1.98r)} \leq y1 \leq 2.297e^{(-1.85r)}$, and $0.1 \leq y1 \leq 3$, $1.32e^{(-10.7b)} \leq y2 \leq 5.95e^{(-14.1b)}$, and $0.3 \leq y2 \leq 4$), therefore, with the accumulation of use time, in the conventional display panel, the difference in the degree of attenuation of the efficacy of any one of the red pixel, the green pixel, and the blue pixel will become larger and larger, resulting in the degree of color shift (value) of the conventional display panel gradually going to a predetermined range (about the numerical range of the display effect) is divergent (i.e., deviated), that is, the display performance of the conventional display panel is getting worse.

In the display panel of the embodiment of the present disclosure, since $0.78e^{(-1.98r)} \leq y1 \leq 2.297e^{(-1.85r)}$, and $0.1 \leq y1 \leq 3$, $1.32e^{(-10.7b)} \leq y2 \leq 5.95e^{(-14.1b)}$, and $0.3 \leq y2 \leq 4$, therefore, In the case of the same usage time as a conventional display panel, the difference in the degree of attenuation of the light effect of any two of the red pixel, the green pixel, and the blue pixel in the display panel of the embodiment of the present disclosure is not much different, and the degree of color shift (value) of the display panel the embodiment of the present disclosure is still within a predetermined range, so that the display panel of the embodiment of the present disclosure maintains a better display performance for a longer duration than the conventional one. The display panel maintains the same display for a longer duration.

In the case where the pixel repeating unit includes one first pixel 101, one second pixel 102, and one third pixel 103, the aperture ratio of the first pixel 101 is equal to the area of the first pixel 101/the area of the pixel repeating unit, the aperture ratio of the second pixel 102 is equal to the area of the second pixel 102/the area of the pixel repeating unit, the aperture ratio of the third pixel 103 is equal to the area of the third pixel 103/the area of the pixel repeating unit.

In the case where the pixel repeating unit includes two first pixel 101, one second pixel 102, and one third pixel 103, the aperture ratio of the first pixels 101 is equal to the area of the two first pixels 101/the area of the pixel repeating unit, the aperture ratio of the second pixel 102 is equal to the area of the second pixel 102/the area of the pixel repeating unit, the aperture ratio of the third pixel 103 is equal to the area of the third pixel 103/the area of the pixel repeating unit.

In the case where the pixel repeating unit includes one first pixel 101, two second pixels 102, and one third pixel 103, the aperture ratio of the first pixel 101 is equal to the area of the first pixel 101/the area of the pixel repeating unit, the aperture ratio of the second pixels 102 is equal to the area of the two second pixels 102/the area of the pixel repeating unit, the aperture ratio of the third pixel 103 is equal to the area of the third pixel 103/the area of the pixel repeating unit.

In the case where the pixel repeating unit includes one first pixel 101, one second pixel 102, and two third pixels 103, the aperture ratio of the first pixel 101 is equal to the area of the first pixel 101/the area of the pixel repeating unit, the aperture ratio of the second pixel 102 is equal to the area of the second pixel 102/the area of the pixel repeating unit, the aperture ratio of the third pixels 103 is equal to the area of the two third pixels 103/the area of the pixel repeating unit.

In a case where the shape of the first pixel 101 is elliptical, the area of the first pixel 101 corresponds to the length of the long axis of the first pixel 101 and the length of the minor axis. In a case where the shape of the first pixel 101 is a circle, an area of the first pixel 101 corresponds to a length of a radius of the first pixel 101.

In the case where the shape of the second pixel 102 is a shape including a convex arc and/or a concave arc, the area of the second pixel 102=the area of the smallest circumcircle of the second pixel 102—a first overlap area of the pixel gap area and the second pixel 102; wherein the pixel gap area includes one of a first gap region between the first pixel 101 and the second pixel 102 and a second gap region between the second pixel 102 and the third pixel 103.

The first overlapping area corresponds to a distance between the first pixel 101 and the second pixel 102, a width of the first gap region, a curvature of an outer peripheral edge line of the first gap region, and also corresponds to a distance between the third pixel 103 and the second pixel 102, the width of the second gap region, and the curvature of an outer peripheral edge line of the second gap region.

In a case where the shape of the third pixel 103 is a shape including a concave arc or a combination of a concave arc and a convex arc, the area of the third pixel 103 is equal to the area of the minimum circumscribed circle of the third pixel 103 minus the second overlapping area of the pixel gap area pair and the third pixel 103. The pixel gap region includes at least one of a third gap region between the third pixel 103 and the first pixel 101 and a second gap region between the second pixel 102 and the third pixel 103.

The second overlapping area corresponds to a distance between the first pixel 101 and the third pixel 103, a width of the third gap region, a curvature of an outer peripheral edge line of the third gap region, and also corresponds to a distance between the third pixel 103 and the second pixel 102, the width of the second gap region, and the curvature of an outer peripheral edge line of the second gap region.

In particular, the shape of the first pixel 101 is elliptical, and the shape of the second pixel 102 and the shape of the third pixel 103 are both formed by convex arcs and/or concave arcs. The area of the first pixel 101, the area of the second pixel 102, and the area of the third pixel 103 are different, the shape of the second pixel 102 and the shape of the third pixel 103 are different, and the size of the second pixel 102 is different from the size of the third pixel 103.

In the case where the shape of the first pixel 101 is elliptical, the ratio of the major axis to the minor axis of the ellipse is in the range of 1 to 5, for example, the ratio is one of 1, 1.3, 1.6, 1.8, 2, 2.3, 2.5, 2.8, 3, 3.3, 3.5, 3.8, 4, 4.3, 4.5, 4.8, and 5. Preferably, the ratio of the major axis to the minor axis of the ellipse is in the range of 1 to 3.

Since the aperture ratios (areas) of the red pixel, the green pixel, and the blue pixel are set according to the luminous efficiency thereof, the current density acting on the different pixels is equal, thereby preventing the display panel from being displayed after the image is displayed (lighting) for a long time. The degree of color shift is out of a predetermined range (that is, the degree of color shift of the display panel is maintained within a predetermined range).

The shape of the at least one of the first pixel 101, the second pixel 102, and the third pixel 103 is a shape formed by a convex arc. The remaining at least two of the first pixel 101, the second pixel 102, and the third pixel 103 are formed by a convex arc and a concave arc. Two of the shapes of the edges of the first pixel 101, the second pixel 102, and the third pixel 103 are complementary in one of the first direction D1, the second direction D2, the third direction D3, and the fourth direction D4. Therefore, between two of the first pixel 101, the second pixel 102, and the third pixel 103, there must be a gap of a considerable width to prevent interference between the two pixels. The technical solution can make full use of the space of the display panel 100, reducing the excess space, so that the aperture ratios of the first pixel 101, the second pixel 102, and the third pixel 103 are improved.

The sum of the radius of curvature of the shape of the edge of the first pixel 101 toward one of the second pixel 102 and the third pixel 103 and the width of the predetermined gap is equal to the radius of curvature of the concave arc. Therefore, the aperture ratios of the first pixel 101, the second pixel 102, and the third pixel 103 can be effectively improved.

Since the two concave arcs in the shape formed by the convex arc and/or the concave arc are connected by the convex arc, it is convenient to manufacture in the corresponding mask (reducing the difficulty of making the mask). In addition, it is advantageous to increase the aperture ratios of the first pixel 101, the second pixel 102, and the third pixel 103.

In the above technical solution, the area of the first pixel, the area of the second pixel, the area of the third pixel are respectively inversely proportional to the luminous efficiency of the luminescent material of the first pixel, the luminous efficiency of the luminescent material of the second pixel, and the luminous efficiency of the luminescent material of the third pixel, so that the embodiment of the present disclosure can avoid issues of color shift of the display panel.

Any two of the first embodiment, the second embodiment, the third embodiment, and the fourth embodiment of the mask (a mask including a through hole having a first shape, a mask including a through hole having a second shape, and a through hole having a third shape) of the present disclosure are same or similar.

The mask of the embodiment of the present disclosure is used to form a pixel (including the first pixel 101, the second pixel 102, and the third pixel 103). Specifically, the mask is used to form an anode layer of a pixel on an array element plate of the display panel 100 and/or form a layer of luminescent material on the pixel defining layer of the display panel 100 by an evaporation process. The array element plate includes a substrate, a thin film transistor switch, an insulating layer, and the like, and the pixel defining layer is disposed on the array element plate.

A through hole is disposed in the mask. At least two of the through holes are along at least two of the first direction D1, the second direction D2, the third direction D3, and the fourth direction D4 and are arranged in an array. The first direction D1 is perpendicular to the second direction D2, and the third direction D3 is a direction having an angle of less than 90 degrees with the first direction D1, and the fourth direction D4 is perpendicular to the third direction D3.

The shape of the through hole is a shape formed by a convex arc and/or a concave arc. That is, the shape of the through hole corresponds to the shape of the pixel (including the first pixel 101, the second pixel 102, and the third pixel 103).

The through holes of different shapes are respectively disposed on different masks, for example, three different shapes of through holes are respectively disposed on three different masks. Alternatively, the through holes of different shapes are all disposed in the same mask, for example, three different shapes of through holes are all disposed in the same mask. The three different shapes include a first shape, a second shape, and a third shape.

The shape formed by the convex arc and/or the concave arc includes: a shape composed of four-segment concave arc (including a circle, an ellipse, etc.), a shape composed of six-segment concave arc, a shape composed of one-segment convex arc and five-segment concave arc, a shape composed of eight-segment concave arc, a shape composed of four-segment convex arc and four-segment concave arc, a shape composed of six-segment convex arc and six-segment concave arc, a shape composed of seven-segment convex arc and five-segment concave arc, and a shape composed of eight-segment convex arc and eight-segment concave arc.

A first projection of the through hole having the first shape (the first through hole 201) in a predetermined coordinate system XOY and a second projection of the through hole having the second shape (the second through hole 301) in the predetermined coordinate system are staggered in any one of the first direction D1, the second direction D2, the third direction D3, and the fourth direction D4.

The first projection of the through hole having the first shape (the first through hole 201) in the predetermined coordinate system and a third projection of the through hole having the third shape (the third through hole 401) in the predetermined coordinate system are staggered in any one of the first direction D1, the second direction D2, the third direction D3, and the fourth direction D4.

A second projection of the through hole having the second shape (the second through hole 301) in the predetermined coordinate system and the third projection of the through hole having the third shape (the third through hole 401) in the predetermined coordinate system are staggered in any one of the first direction D1, the second direction D2, the third direction D3, and the fourth direction D4.

Shapes of opposite edges of adjacent two of the first projection, the second projection, and the third projection are complementary in one of the first direction D1, the second direction D2, the third direction D3, and the fourth direction D4.

Two number axes of the predetermined coordinate system are parallel to the first direction D1 and the second direction D2, respectively.

The shape of any one of the first projection, the second projection, and the third projection is a shape formed by a convex arc and/or a concave arc.

The shape of at least one of the first projection, the second projection, and the third projection is a shape formed by a convex arc, the shape of at most two of the first projection, the second projection, and the third projection is a shape formed by a convex arc, and the shapes of the remaining at least two of the first projection, the second projection, and the third projection are a shape formed by a concave arc, or the shapes of the remaining at least two of the first projection, the second projection, and the third projection are formed by a convex arc and a concave arc (a convex arc connecting the two concave arcs).

At least two of the first projection, the second projection, and the third projection are alternately arranged in at least one of the first direction D1, the second direction D2, the third direction D3, and the fourth direction D4.

Specifically, a first projection array composed of at least two of the first projections, a second projection array composed of at least two of the second projections, and a third projection array composed of at least two of the third projections are embedded in each other. At least one of the first projections is located in a range surrounded by at least four of the second projections, at least one of the first projections is located in a range surrounded by at least four of the third projections, at least one of the second projections is located in a range surrounded by at least four of the first projections, at least one of the second projections is located in a range surrounded by at least four of the third projections, at least one of the third projections is located in a range surrounded by at least four of the first projections, and at least one of the third projections is located in a range surrounded by at least four of the second projections.

A first gap is disposed between the first projection and the adjacent second projection, a second gap is disposed between the second projection and the adjacent third projection, and a third gap is disposed between the third projection and the adjacent first projection.

At least a portion of the third projection is convex toward the first gap, at least a portion of the first projection is convex toward the second gap, and at least a portion of the second projection is convex toward the third gap.

The width of the gap between two of the first projection, the second projection, and the third projection alternately arranged in the third direction D3 is equal to the width of the gap between two of the first projection, the second projection, and the third projection alternately arranged in the fourth direction D4.

The shape of the first through hole 201 is circular or elliptical, and the shape of the second through hole 301 is one of circular, elliptical, and a shape formed by a convex arc and/or a concave arc. The shape of the third through hole 401 is a shape formed by concave arc or a combination of a concave arc and a convex arc. The circular or elliptical shape is one of the shapes formed by the convex arcs. Of course, the shape formed by the convex arcs may further include other shapes.

The shape formed by the convex arc and/or the concave arc includes: a shape composed of a convex arc, a shape composed of four-segment concave arc, a shape composed of six-segment concave arc, a shape composed of one-segment convex arc and five-segment concave arc, a shape composed of eight-segment concave arc, a shape composed of four-segment convex arc and four-segment concave arc, a shape composed of six-segment convex arc and six-segment concave arc, a shape composed of seven-segment convex arc and five-segment concave arc, and a shape composed of eight-segment convex arc and eight-segment concave arc.

In the shape composed of four-segment concave arc, the four-segment concave arc is connected end to end.

In the shape composed of six-segment concave arc, the six-segment concave arc is connected end to end.

In the shape composed of one-segment convex arc and five-segment concave arc, the one-segment convex arc and the five-segment concave arc connected end to end.

In the shape composed of eight-segment concave arc, the eight-segment concave arc is connected end to end.

In the shape composed of four-segment convex arc and four-segment concave arc, two ends of the convex arc are respectively connected to two adjacent concave arcs, and two ends of the concave arc are respectively connected to two adjacent convex arcs.

In the shape composed of six-segment convex arc and six-segment concave arc, two ends of the convex arc are respectively connected to two adjacent concave arcs, and two ends of the concave arc are respectively connected to two adjacent convex arcs.

In the shape composed of seven-segment convex arc and five-segment concave arc, the seven-segment convex arc and the five-segment concave arc are connected end to end. The seven-segment convex arc and the five-segment concave arc are connected together at intervals.

In the shape composed of eight-segment convex arc and eight-segment concave arc, two ends of the convex arc are respectively connected to two adjacent concave arcs, and two ends of the concave arc are respectively connected to two adjacent convex arcs.

Figure 5A:
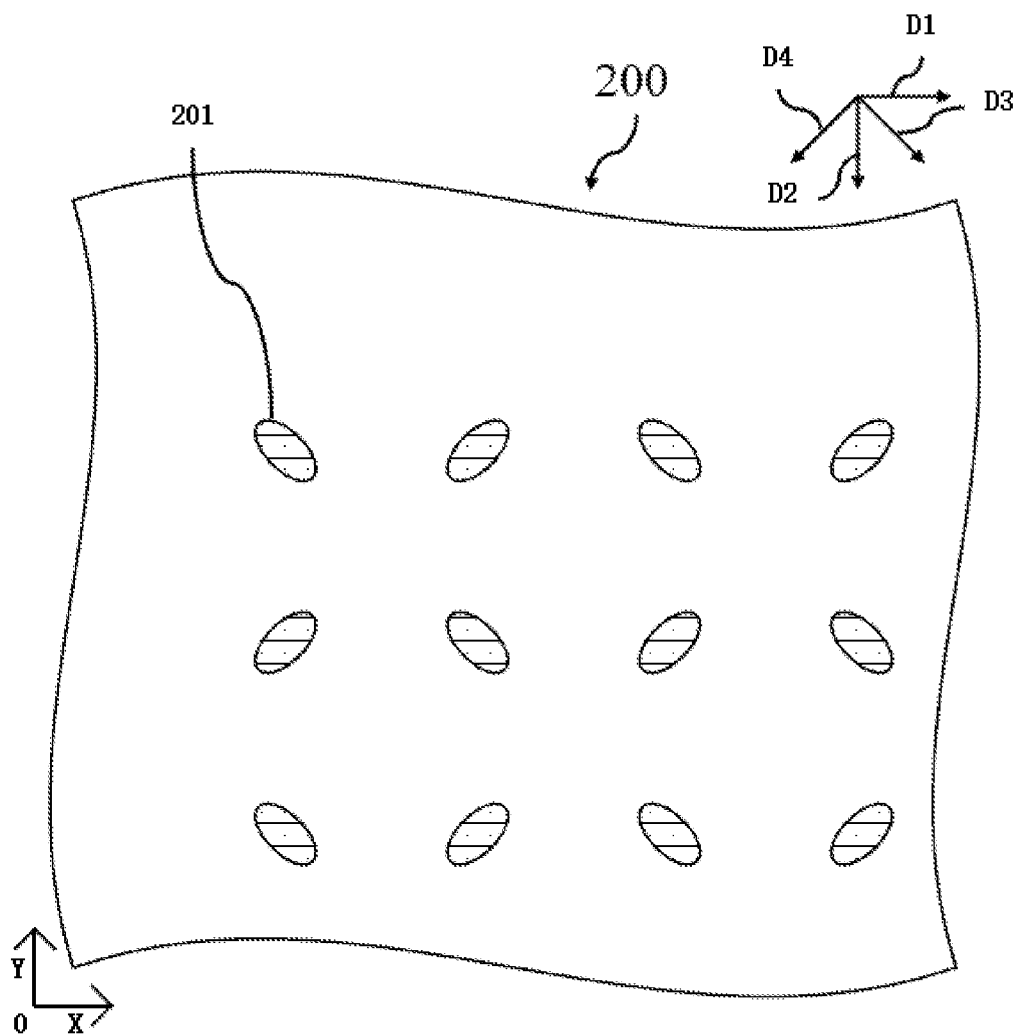
FIG. 5A is a schematic view of a shape and a position of a first through hole in a first mask according to a first embodiment of the present disclosure.
Figure 5B:
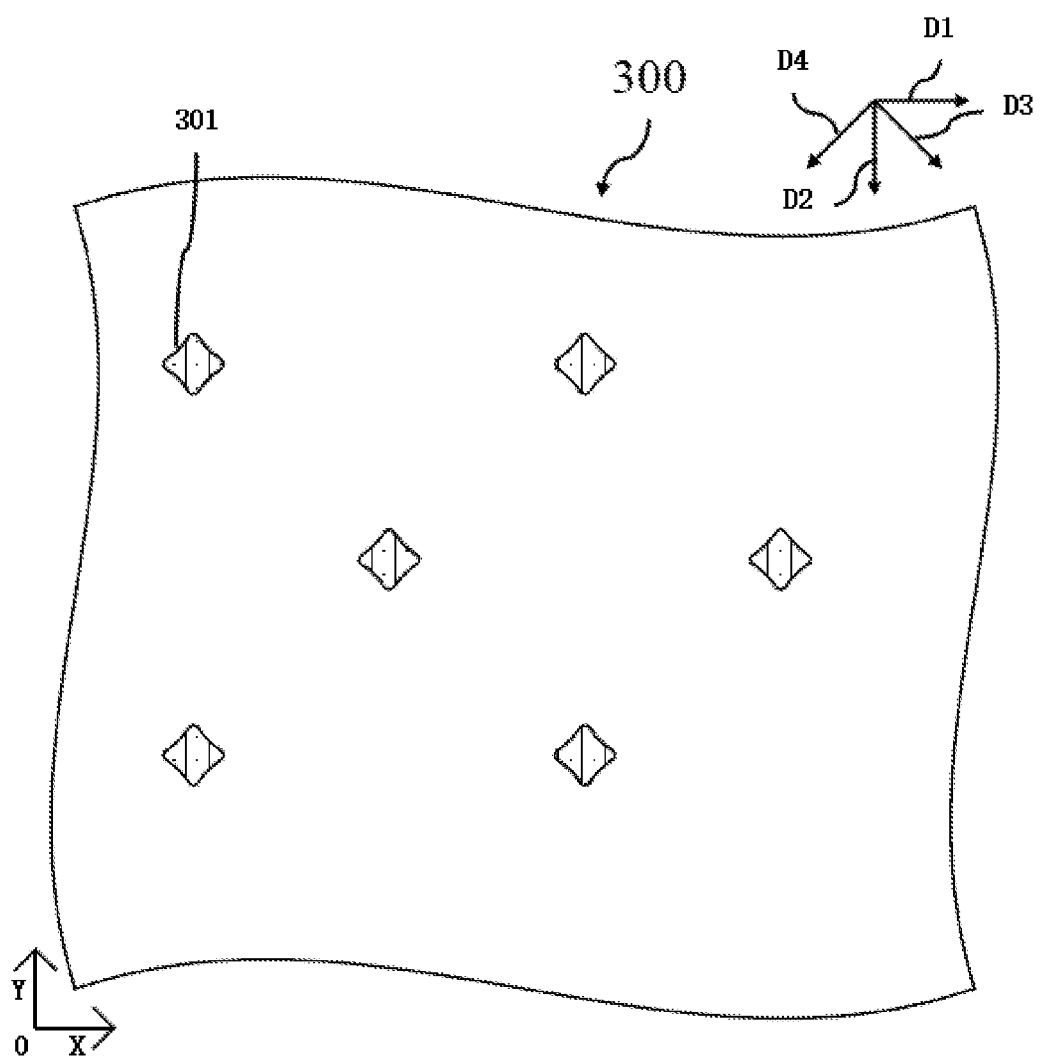
FIG. 5B is a schematic view of a shape and a position of a second through hole in a second mask according to a first embodiment of the present disclosure.
Figure 5C:
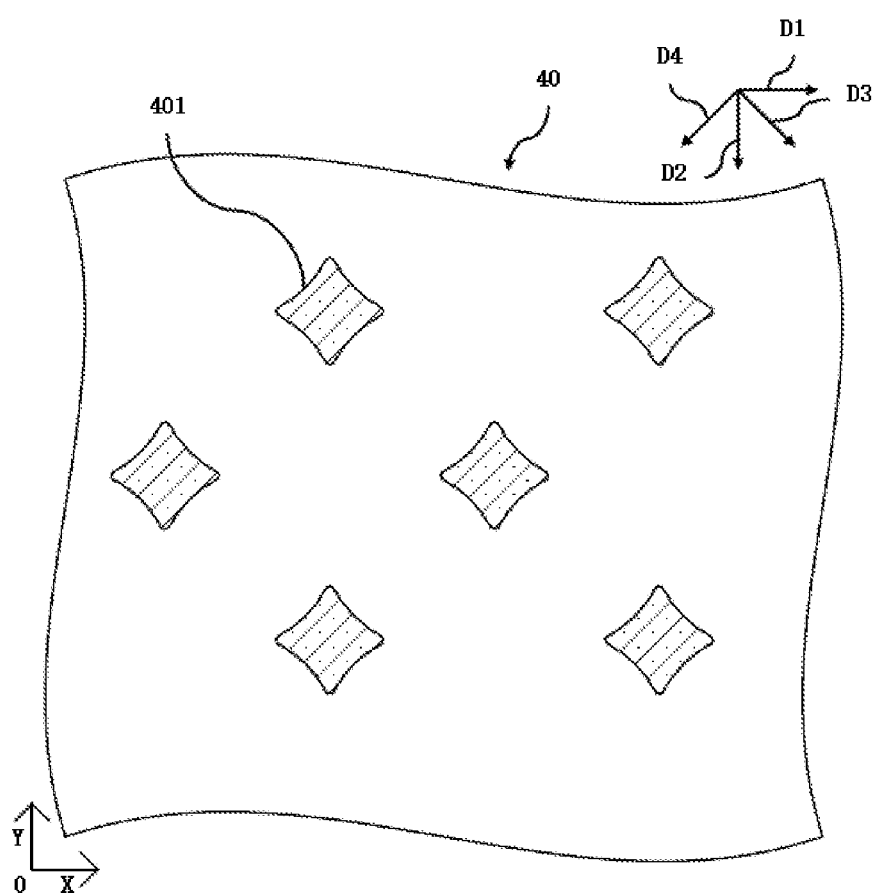
FIG. 5C is a schematic view of a shape and a position of a third through hole in a second mask according to a third embodiment of the present disclosure.

As shown in FIG. 5A, FIG. 5B, and FIG. 5C, the shape of the first through hole 201 is circular or elliptical, and the shapes of the second through hole 301 and the third through hole 401 are both a shape composed of four-segment convex arc and four-segment concave arc.

Figure 6A:
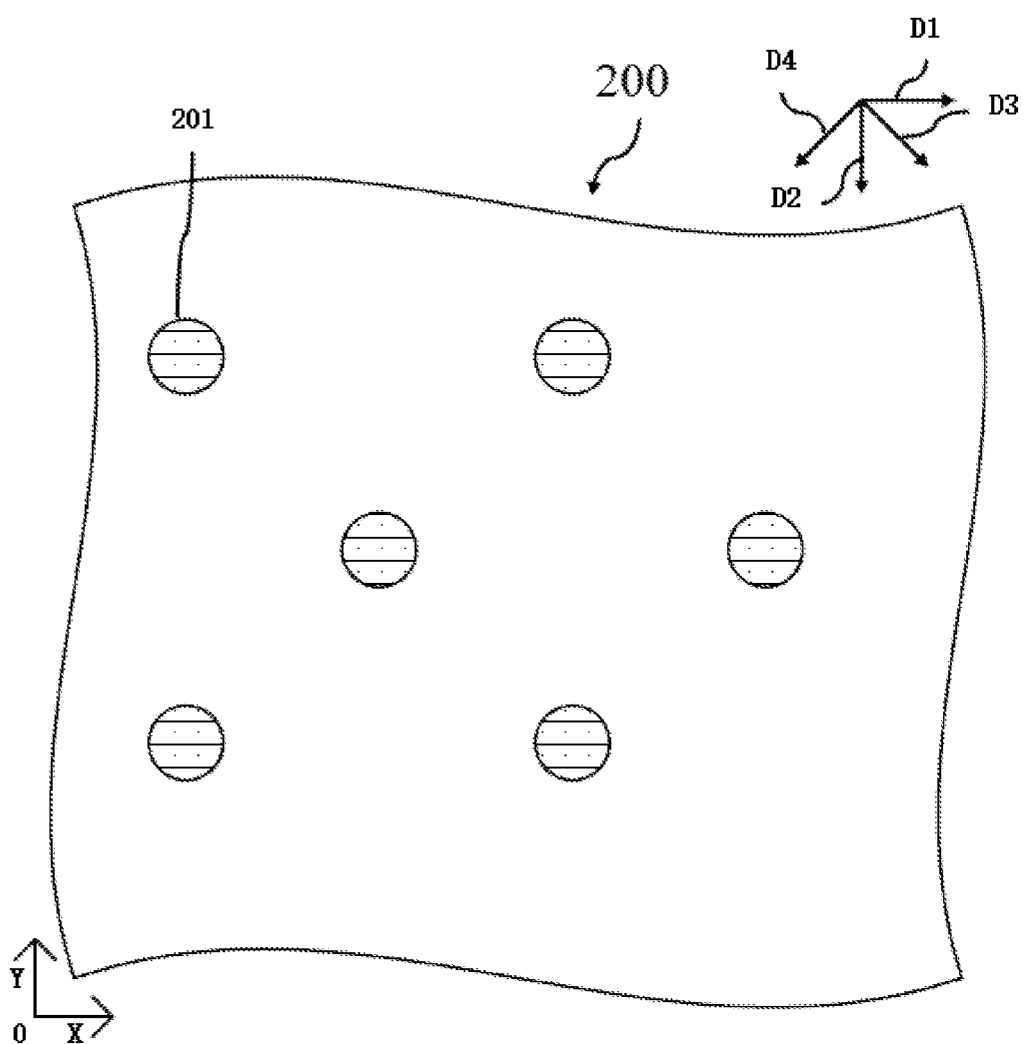
FIG. 6A is a schematic view of a shape and a position of a first through hole in a first mask according to a first embodiment of the present disclosure.
Figure 6B:
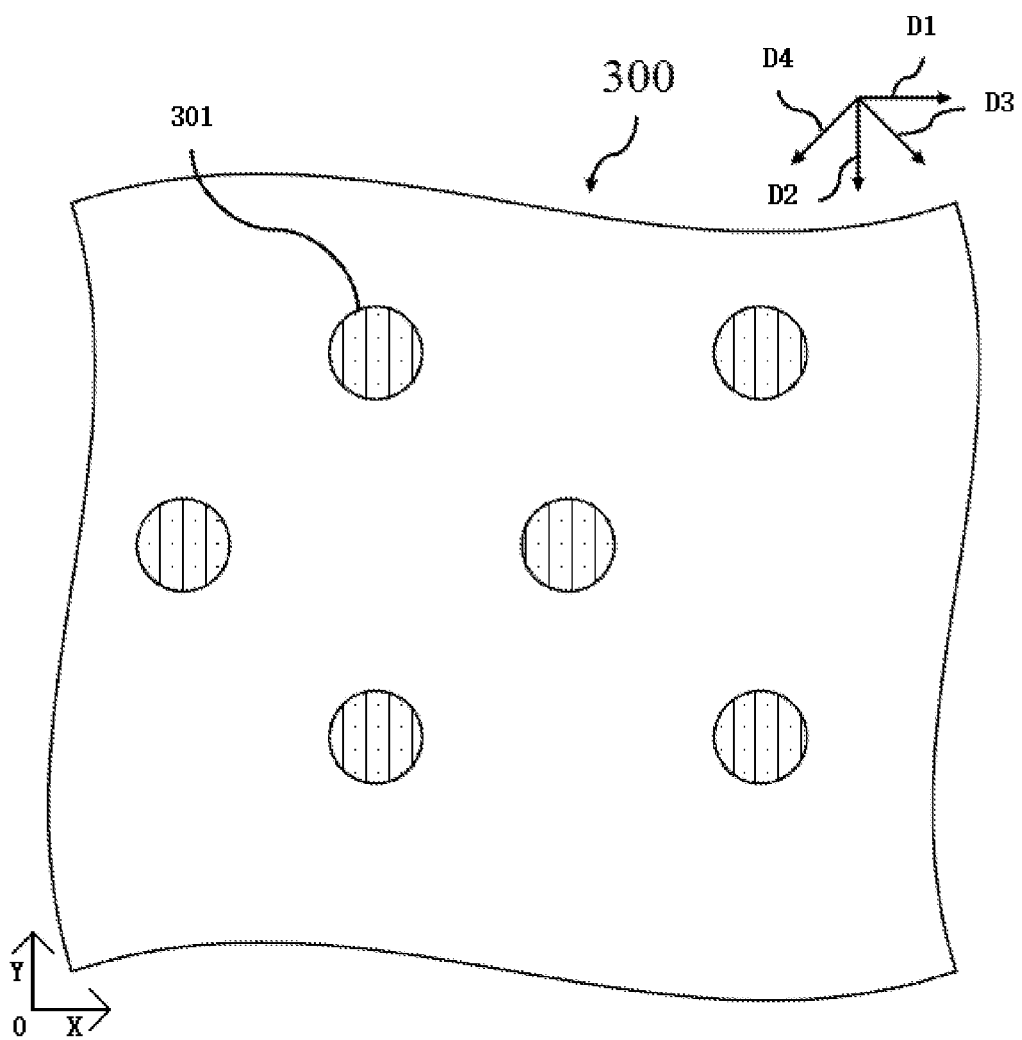
FIG. 6B is a schematic view of a shape and a position of a second through hole in a second mask according to a first embodiment of the present disclosure.
Figure 6C:
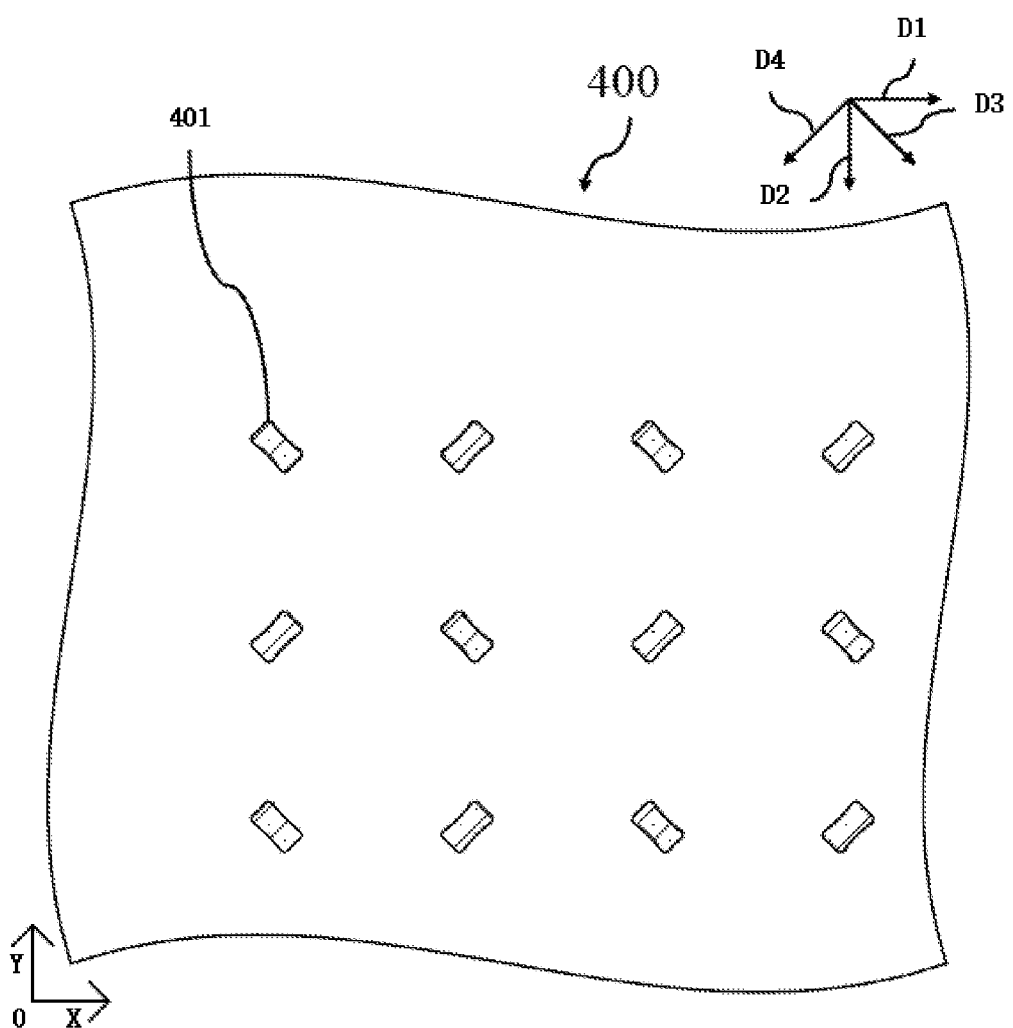
FIG. 6C is a schematic view of a shape and a position of a third through hole in a second mask according to a third embodiment of the present disclosure.

As shown in FIG. 6A, FIG. 6B, and FIG. 6C, the shape of the first through hole 201 is circular or elliptical, the shape of the second through hole 301 is circular or elliptical, and the third through hole 401 is a shape composed of four-segment convex arc and four-segment concave arc.

Figure 7A:
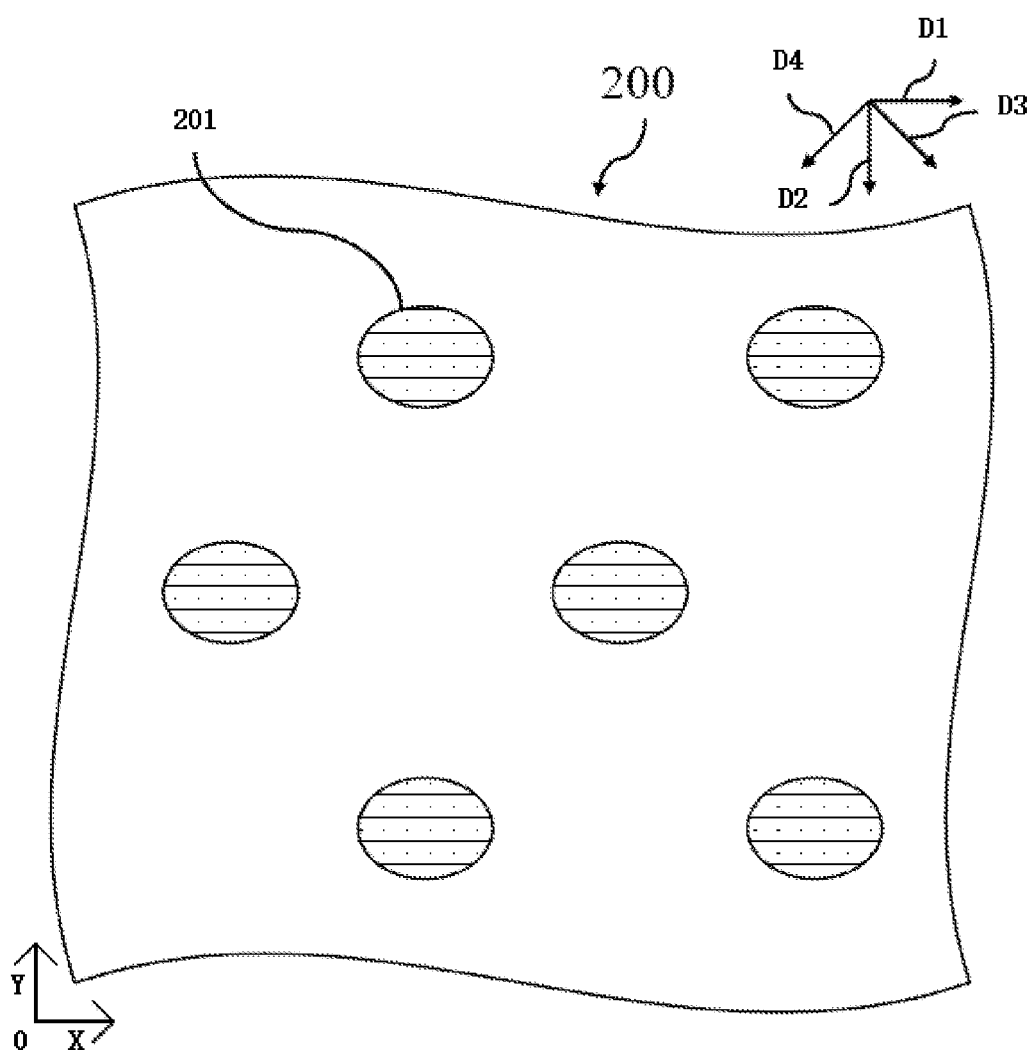
FIG. 7A is a schematic view of a shape and a position of a first through hole in a first mask according to a first embodiment of the present disclosure.
Figure 7B:
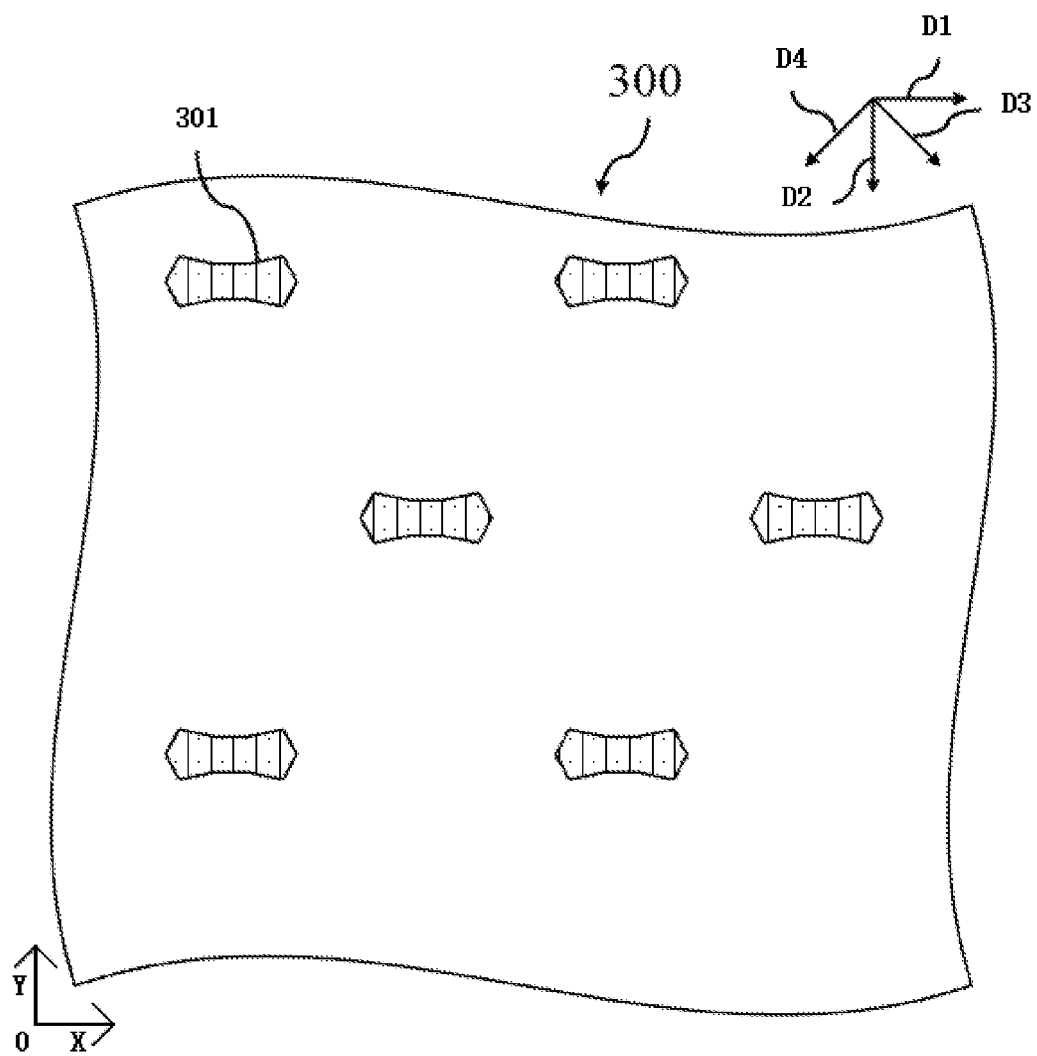
FIG. 7B is a schematic view of a shape and a position of a second through hole in a second mask according to a first embodiment of the present disclosure.
Figure 7C:
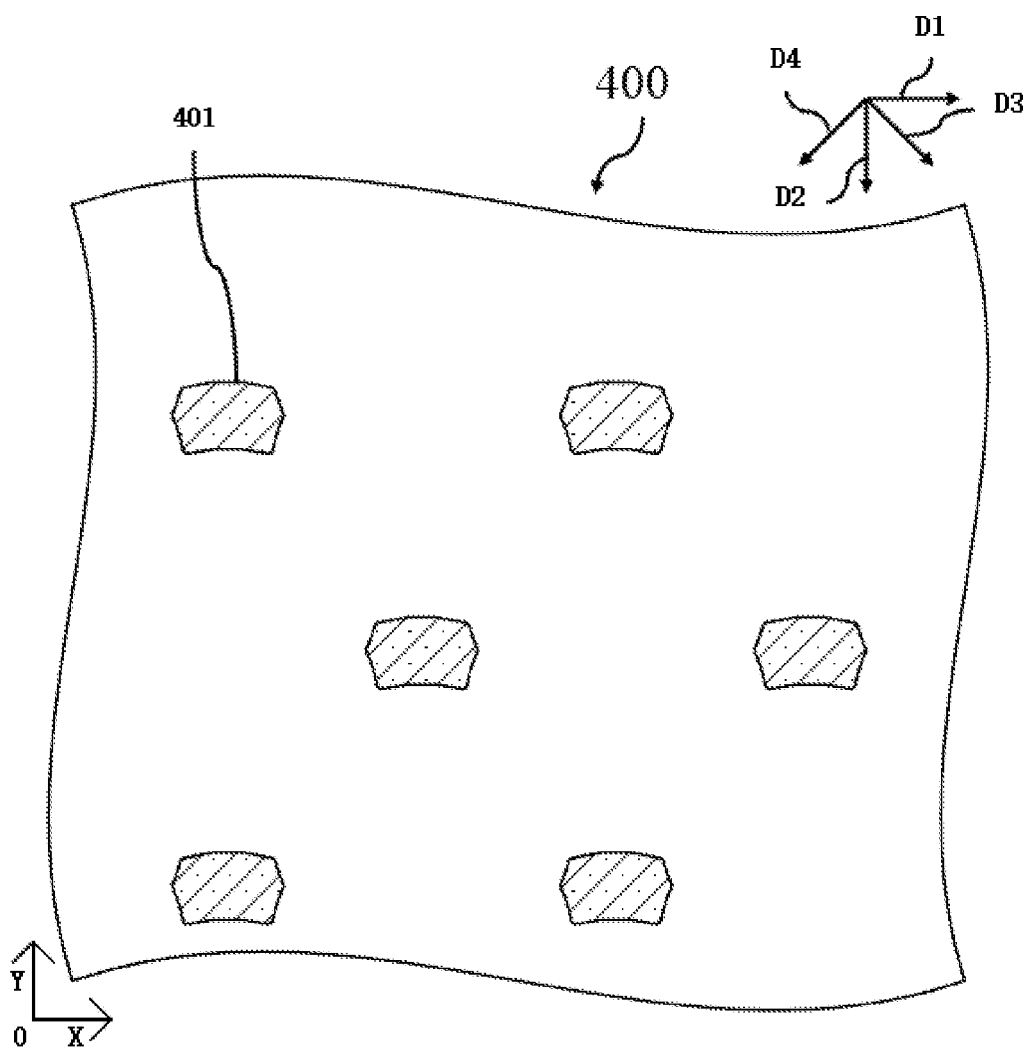
FIG. 7C is a schematic view of a shape and a position of a third through hole in a second mask according to a third embodiment of the present disclosure.

As shown in FIG. 7A, FIG. 7B, and FIG. 7C, the shape of the first through hole 201 is circular or elliptical, the second through hole 301 is a shape composed of six-segment convex arc and six-segment concave arc, and the third through hole 401 is a shape composed of seven-segment convex arc and five-segment concave arc.

Figure 8A:
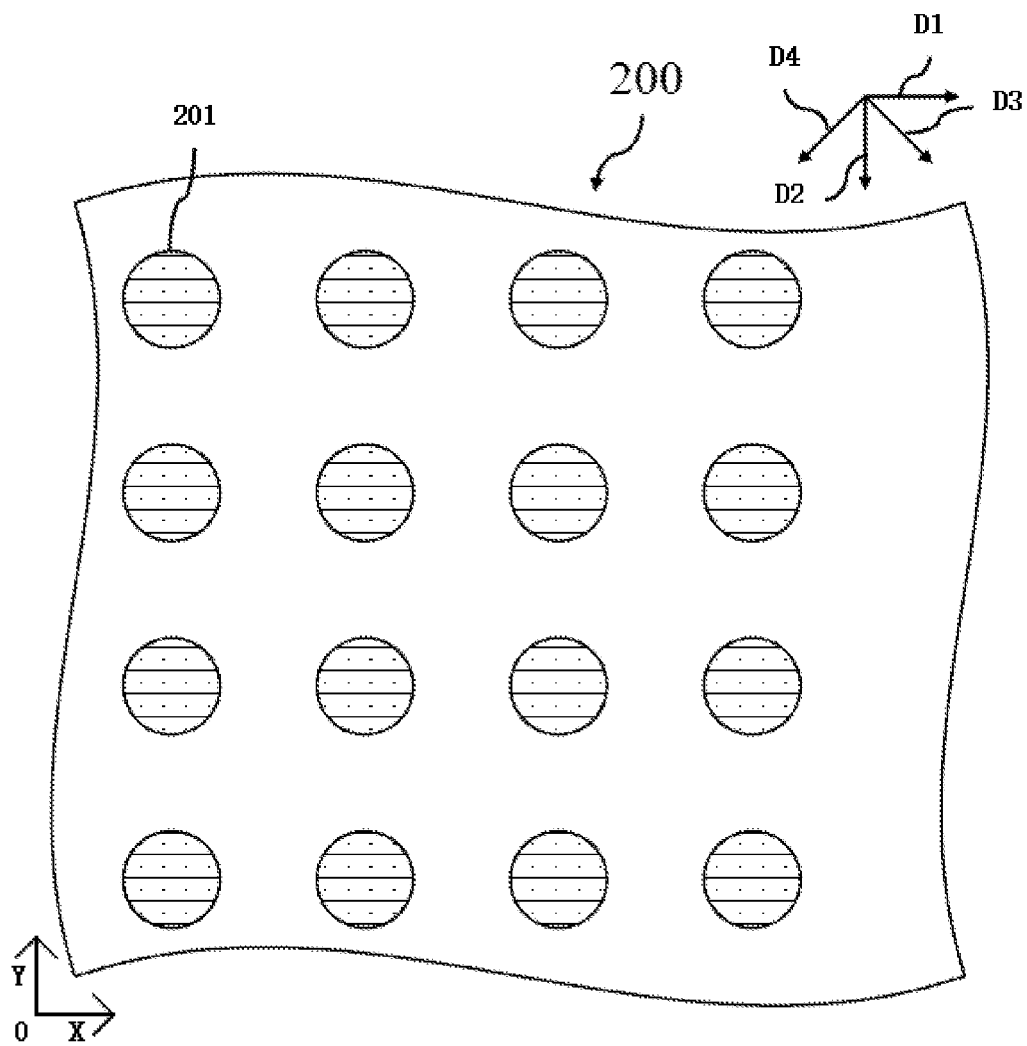
FIG. 8A is a schematic view of a shape and a position of a first through hole in a first mask according to a first embodiment of the present disclosure.
Figure 8B:
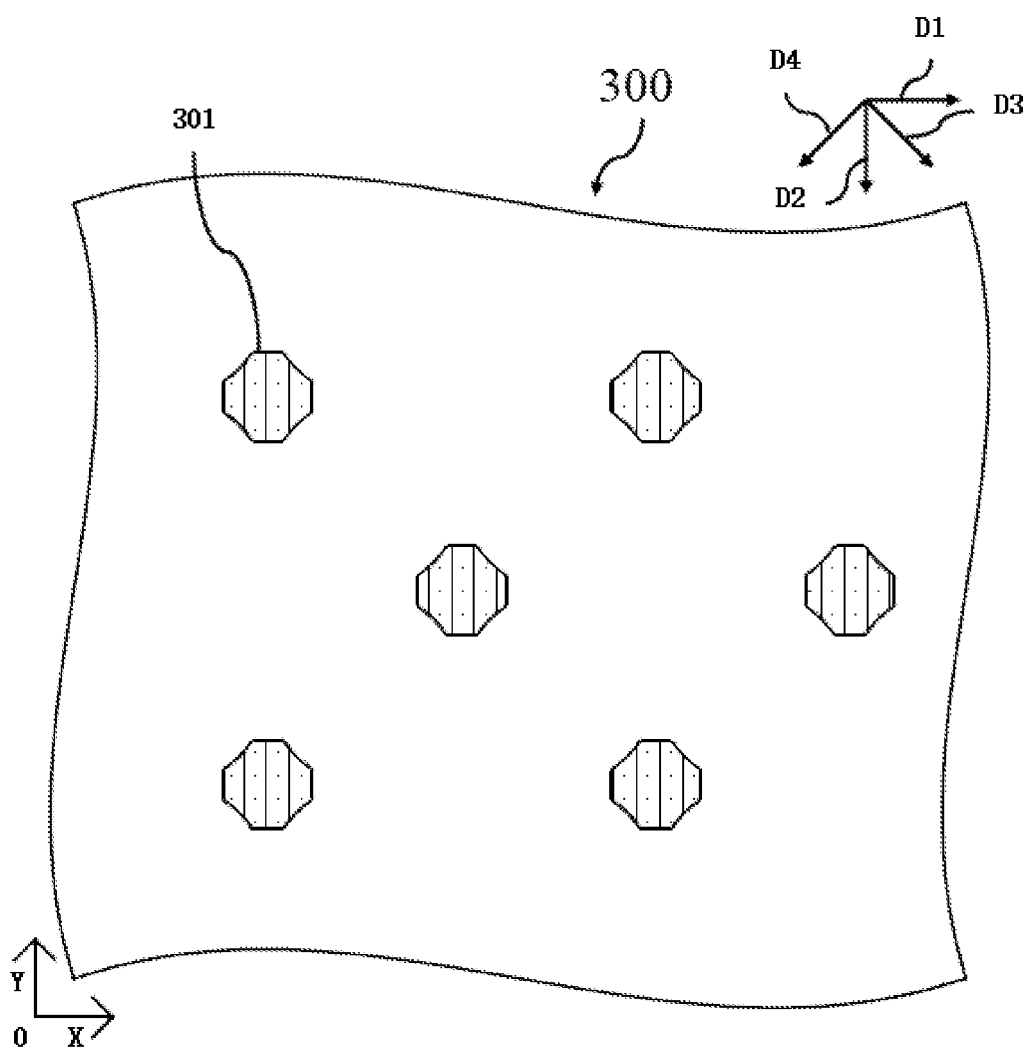
FIG. 8B is a schematic view of a shape and a position of a second through hole in a second mask according to a first embodiment of the present disclosure.
Figure 8C:
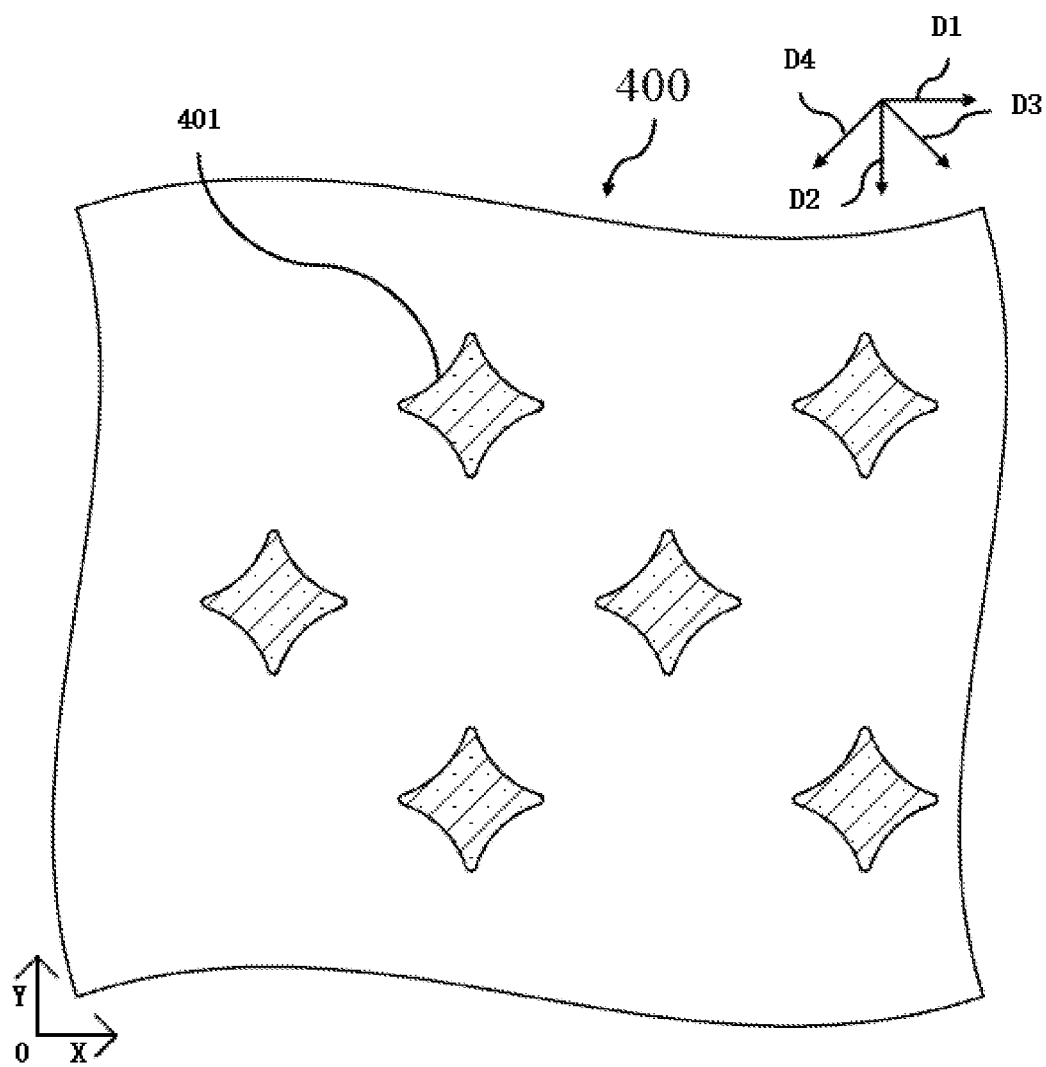
FIG. 8C is a schematic view of a shape and a position of a third through hole in a second mask according to a third embodiment of the present disclosure.

As shown in FIG. 8A, FIG. 8B, and FIG. 8C, the shape of the first through hole 201 is circular or elliptical, the second through hole 301 is a shape composed of eight-segment convex arc and eight-segment concave arc, and the third through hole 401 is a shape composed of four-segment convex arc and four-segment concave arc.

The shape composed of a convex arc, the shape composed of four-segment concave arc, the shape composed of six-segment concave arc, the shape composed of eight-segment concave arc, the shape composed of four-segment convex arc and four-segment concave arc, the shape composed of six-segment convex arc and six-segment concave arc, and the shape composed of eight-segment convex arc and eight-segment concave arc are centrally symmetrical.

Shapes, sizes, and areas of any two of the first projection, the second projection, and the third projection are different.

The shape of the edge of one of the second projection and the third projection in the third direction D3 or the fourth direction D4 corresponds to a concave arc.

A sum of a radius of curvature of a shape of an edge of one of the first projection, the second projection, and the third projection and a width of a predetermined gap is equal to a radius of curvature of the concave arc corresponding to the edge of one of the first projection, the second projection, and the third projection in the third direction D3 and the fourth direction D4.

The predetermined gap is a gap between an edge of one of the first projection, the second projection, and the third projection and an edge of the adjacent the first projection in one of the third direction D3 and the fourth direction D4. A width of the predetermined gap in the third direction D3 is equal to a width of the predetermined gap in the fourth direction D4.

An arc and an extended arc thereof corresponding to an edge of the third projection facing the first projection and an arc and an extended arc thereof corresponding to an edge of the second projection facing the first projection form a predetermined shape, and the predetermined shape includes a circle or an ellipse.

A shape of each of the first projection is the same as or similar to the predetermined shape.

A center of a shape of each of the first projection is the same as a center of the predetermined shape.

When the shape of the first projection includes an ellipse, a long axis of the ellipse points to one of the second projection and the third projection, a short axis of the ellipse points to the other of the second projection and the third projection.

An angle between the long axis of the ellipse and the first direction D1 or the second direction D2 ranges between 0 degree and 90 degrees.

When a shape of the second projection includes a circle or an ellipse, and a shape of the third projection includes a concave arc or a combined shape of a concave arc and a convex arc, the shape of the third projection includes a curvature of one of at least four concave arcs that is greater or less than another of the at least four concave arcs.

When a shape of the second projection and a shape of the third projection both include a concave arc or a combined shape of a concave arc and a convex arc, a curvature of one of at least four concave arcs of the shape of the third projection is greater or equal to a curvature of one of at least four concave arcs of the shape of the second projection.

Any two of the first embodiment, the second embodiment, the third embodiment, and the fourth embodiment of the mask assembly of the embodiment of the present disclosure are same or similar.

The mask assembly of the embodiment of the present disclosure includes three masks in which a through hole is provided.

At least two of the through holes are arranged in an array in at least two directions of the first direction D1, the second direction D2, the third direction D3, and the fourth direction D4. The first direction D1 is perpendicular to the second direction D2, and the third direction D3 is a direction having an angle of less than 90 degrees with the first direction D1, and the fourth direction D4 is perpendicular to the third direction D3.

The shape of the through hole is a shape formed by a convex arc and/or a concave arc.

The three masks are the first mask 200, the second mask 300, and the third mask 400, respectively. The through hole of the first mask 200 is the first through hole 201, the through hole of the second mask 300 is the second through hole 301, and the through hole of the third mask 400 is the third through hole 401.

A first projection of the first through hole 201 in a predetermined coordinate system and a second projection of the second through hole 301 in the predetermined coordinate system are staggered in any one of the first direction D1, the second direction D2, the third direction D3, and the fourth direction D4.

The first projection of the first through hole 201 in the predetermined coordinate system and a third projection of the third through hole 401 in the predetermined coordinate system are staggered in any one of the first direction D1, the second direction D2, the third direction D3, and the fourth direction D4.

A second projection of the second through hole 301 in the predetermined coordinate system and the third projection of the third through hole 401 in the predetermined coordinate system are staggered in any one of the first direction D1, the second direction D2, the third direction D3, and the fourth direction D4.

Two number axes of the predetermined coordinate system are parallel to the first direction D1 and the second direction D2, respectively.

The shape of any one of the first projection, the second projection, and the third projection is a shape formed by a convex arc and/or a concave arc.

The shape of at least one of the first projection, the second projection, and the third projection is a shape formed by a convex arc, the shape of at most two of the first projection, the second projection, and the third projection is a shape formed by a convex arc, and the shapes of the remaining at least two of the first projection, the second projection, and the third projection are a shape formed by a concave arc, or the shapes of the remaining at least two of the first projection, the second projection, and the third projection are formed by a convex arc and a concave arc (a convex arc connecting the two concave arcs).

Shapes of edges of two of the first projection, the second projection, and the third projection are complementary in one of the first direction, the second direction, the three direction, and the fourth direction.

At least two of the first projection, the second projection, and the third projection are alternately arranged in at least one of the first direction D1, the second direction D2, the third direction D3, and the fourth direction D4.

Specifically, a first projection array composed of at least two of the first projections, a second projection array composed of at least two of the second projections, and a third projection array composed of at least two of the third projections are embedded in each other. At least one of the first projections is located in a range surrounded by at least four of the second projections, at least one of the first projections is located in a range surrounded by at least four of the third projections, at least one of the second projections is located in a range surrounded by at least four of the first projections, at least one of the second projections is located in a range surrounded by at least four of the third projections, at least one of the third projections is located in a range surrounded by at least four of the first projections, and at least one of the third projections is located in a range surrounded by at least four of the second projections.

A first gap is disposed between the first projection and the adjacent second projection, a second gap is disposed between the second projection and the adjacent third projection, and a third gap is disposed between the third projection and the adjacent first projection.

At least a portion of the third projection is convex toward the first gap, at least a portion of the first projection is convex toward the second gap, and at least a portion of the second projection is convex toward the third gap.

The width of the gap between two of the first projection, the second projection, and the third projection alternately arranged in the third direction D3 is equal to the width of the gap between two of the first projection, the second projection, and the third projection alternately arranged in the fourth direction D4.

The shape of the first through hole 201 is circular or elliptical, and the shape of the second through hole 301 is one of circular, elliptical, and a shape formed by a convex arc and/or a concave arc. The shape of the third through hole 401 is a shape formed by concave arc or a combination of a concave arc and a convex arc. The circular or elliptical shape is one of the shapes formed by the convex arcs. Of course, the shape formed by the convex arcs may further include other shapes.

The shape formed by the convex arc and/or the concave arc includes: a shape composed of a convex arc, a shape composed of four-segment concave arc, a shape composed of six-segment concave arc, a shape composed of one-segment convex arc and five-segment concave arc, a shape composed of eight-segment concave arc, a shape composed of four-segment convex arc and four-segment concave arc, a shape composed of six-segment convex arc and six-segment concave arc, a shape composed of seven-segment convex arc and five-segment concave arc, and a shape composed of eight-segment convex arc and eight-segment concave arc.

In the shape composed of four-segment concave arc, the four-segment concave arc is connected end to end.

In the shape composed of six-segment concave arc, the six-segment concave arc is connected end to end.

In the shape composed of one-segment convex arc and five-segment concave arc, the one-segment convex arc and the five-segment concave arc connected end to end.

In the shape composed of eight-segment concave arc, the eight-segment concave arc is connected end to end.

In the shape composed of four-segment convex arc and four-segment concave arc, two ends of the convex arc are respectively connected to two adjacent concave arcs, and two ends of the concave arc are respectively connected to two adjacent convex arcs.

In the shape composed of six-segment convex arc and six-segment concave arc, two ends of the convex arc are respectively connected to two adjacent concave arcs, and two ends of the concave arc are respectively connected to two adjacent convex arcs.

In the shape composed of seven-segment convex arc and five-segment concave arc, the seven-segment convex arc and the five-segment concave arc are connected end to end. The seven-segment convex arc and the five-segment concave arc are connected together at intervals.

In the shape composed of eight-segment convex arc and eight-segment concave arc, two ends of the convex arc are respectively connected to two adjacent concave arcs, and two ends of the concave arc are respectively connected to two adjacent convex arcs.

As shown in FIG. 5A, FIG. 5B, and FIG. 5C, the shape of the first through hole 201 is circular or elliptical, and the shapes of the second through hole 301 and the third through hole 401 are both a shape composed of four-segment convex arc and four-segment concave arc.

As shown in FIG. 6A, FIG. 6B, and FIG. 6C, the shape of the first through hole 201 is circular or elliptical, the shape of the second through hole 301 is circular or elliptical, and the third through hole 401 is a shape composed of four-segment convex arc and four-segment concave arc.

As shown in FIG. 7A, FIG. 7B, and FIG. 7C, the shape of the first through hole 201 is circular or elliptical, the second through hole 301 is a shape composed of six-segment convex arc and six-segment concave arc, and the third through hole 401 is a shape composed of seven-segment convex arc and five-segment concave arc.

As shown in FIG. 8A, FIG. 8B, and FIG. 8C, the shape of the first through hole 201 is circular or elliptical, the second through hole 301 is a shape composed of eight-segment convex arc and eight-segment concave arc, and the third through hole 401 is a shape composed of four-segment convex arc and four-segment concave arc.

The shape composed of a convex arc, the shape composed of four-segment concave arc, the shape composed of six-segment concave arc, the shape composed of eight-segment concave arc, the shape composed of four-segment convex arc and four-segment concave arc, the shape composed of six-segment convex arc and six-segment concave arc, and the shape composed of eight-segment convex arc and eight-segment concave arc are centrally symmetrical.

Shapes, sizes, and areas of any two of the first projection, the second projection, and the third projection are different.

The shape of the edge of one of the second projection and the third projection in the third direction D3 or the fourth direction D4 corresponds to a concave arc.

A sum of a radius of curvature of a shape of an edge of one of the first projection, the second projection, and the third projection and a width of a predetermined gap is equal to a radius of curvature of the concave arc.

The predetermined gap is a gap between an edge of one of the first projection, the second projection, and the third projection and an edge of the adjacent the first projection in one of the third direction D3 and the fourth direction D4. A width of the predetermined gap in the third direction D3 is equal to a width of the predetermined gap in the fourth direction D4.

An arc and an extended arc thereof corresponding to an edge of the third projection facing the first projection and an arc and an extended arc thereof corresponding to an edge of the second projection facing the first projection form a predetermined shape, and the predetermined shape includes a circle or an ellipse.

A shape of each of the first projection is the same as or similar to the predetermined shape.

A center of a shape of each of the first projection is the same as a center of the predetermined shape.

When the shape of the first projection includes an ellipse, a long axis of the ellipse points to one of the second projection and the third projection, a short axis of the ellipse points to the other of the second projection and the third projection.

An angle between the long axis of the ellipse and the first direction D1 or the second direction D2 ranges between 0 degree and 90 degrees.

When a shape of the second projection includes a circle or an ellipse, and a shape of the third projection includes a concave arc or a combined shape of a concave arc and a convex arc, the shape of the third projection includes a curvature of one of at least four concave arcs that is greater or less than another of the at least four concave arcs.

When a shape of the second projection and a shape of the third projection both include a concave arc or a combined shape of a concave arc and a convex arc, a curvature of one of at least four concave arcs of the shape of the third projection is greater or equal to a curvature of one of at least four concave arcs of the shape of the second projection.

In the above technical solution, since the mask assembly includes three masks, the mask is provided with a through hole. The through hole has a shape formed by a convex arc and/or a concave arc. The masks are respectively a first mask, a second mask, and a third mask. The first through hole of the first mask has a first projection in the predetermined coordinate system, the second through hole of the second mask has a second projection in the predetermined coordinate system, and the third through hole of the third mask has the third projection in the predetermined coordinate system. The shapes of the opposite edges of the adjacent two of the first projection, the second projection, and the third projections are complementary, so that the embodiment of the present disclosure can reduce the unused area between the pixels in the display panel, thereby increasing the aperture ratio of the pixels.

Figure 11:
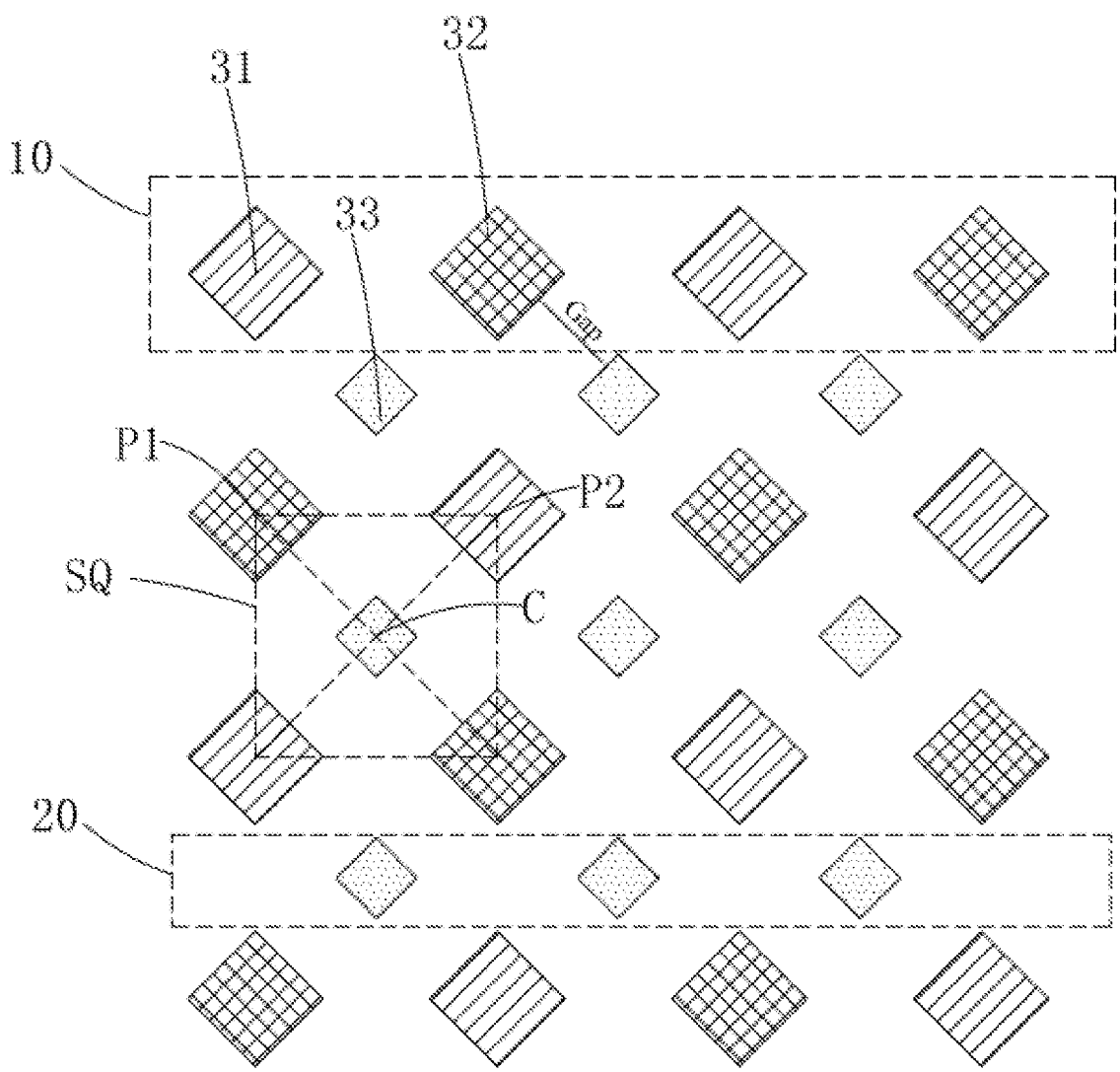
FIG. 11 is a schematic diagram of a pixel arrangement structure according to a first embodiment the present invention.

Referring to FIG. 11, in a pixel arrangement structure according to a first embodiment of the present invention, the pixel arrangement structure includes a plurality of first pixel rows 20 and a plurality of second pixel rows 10 arranged alternately. Each second pixel row 10 includes a plurality of second pixels 32 and a plurality of third pixels 31 arranged alternately and at intervals, and each first pixel row 20 includes a plurality of first pixels 33 arranged at intervals. Two third pixels 31 and two second pixels 32 adjacent to the first pixel 33 form a virtual box SQ, and the first pixel 33 is arranged in the virtual box SQ formed by the two third pixels 31 and the two second pixels 32 adjacent thereto, an area of the third pixel 31 is same as an area of the second pixel 32, and the area of the third pixel 31 and the area of the second pixel 32 are greater than an area of the first pixel 33.

In details, as illustrated in FIG. 11, in the first embodiment, a center of the third pixel 31 coincides with a first vertex P1 of the virtual box SQ, a center of the second pixel 32 coincides with a second vertex P2 adjacent to the first vertex P1 of the virtual box SQ, and a center of the first pixel 33 coincides with a center C of the virtual box SQ.

Further, shapes of the third pixel 31, the second pixel 32, and the first pixel 33 are all square, and diagonal lines of each third pixel 31 and each second pixel 32 in each second pixel row 10 are on a same straight line, and a diagonal line of the first pixel 33 is parallel to a diagonal line of the third pixel 31. Therefore, four first sides of each third pixel 31 are respectively opposite to four first pixels 33 adjacent thereto, four first sides of each second pixel 32 are respectively opposite to four first pixels 33 adjacent thereto, and four first sides of each first pixel 33 are respectively opposite to two third pixels 31 and two second pixels 32 adjacent thereto.

Preferably, the third pixel 31, the second pixel 32, and the first pixel 33 have different colors and are one of a red pixel, a blue pixel, and a green pixel. In the first embodiment, the third pixel 31, the second pixel 32, and the first pixel 33 emit red light, blue light, and green light respectively. Corresponding to the OLED display panel, that is, the third pixel 31, the second pixel 32, and the first pixel 33 include organic light emitting diodes that emit red light, blue light, and green light, respectively. It is understood that, in other embodiments of the present invention, the third pixel 31, the second pixel 32, and the first pixel 33 may also emit light of other colors.

Figure 15:
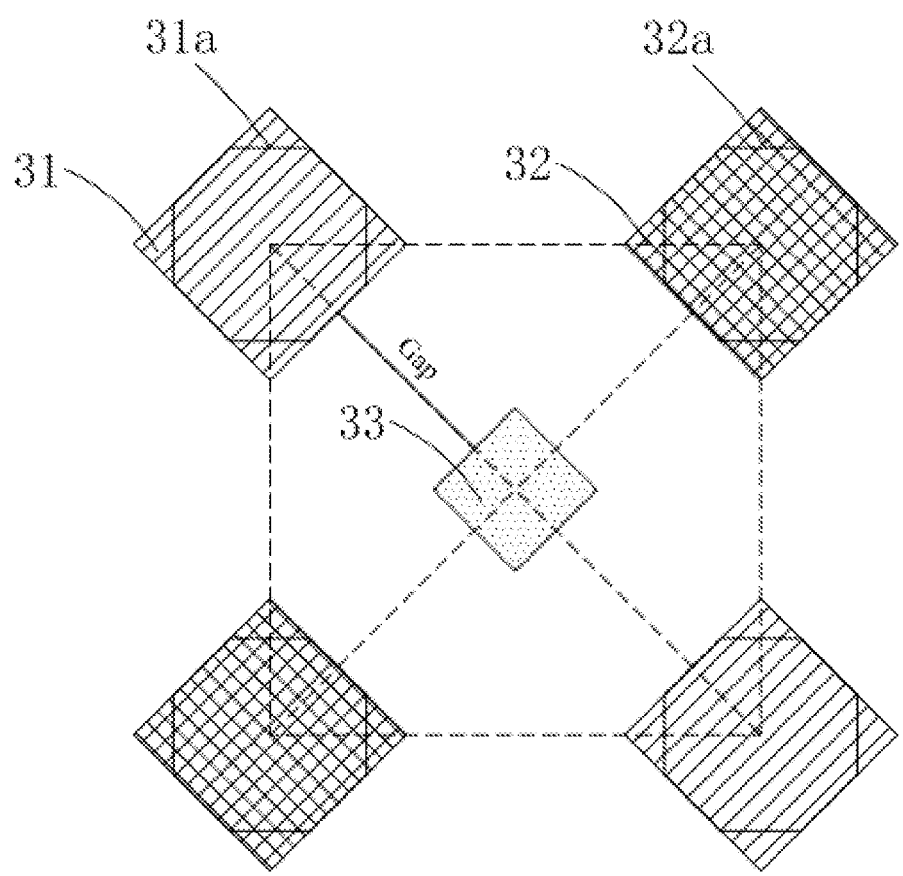
FIG. 15 is a schematic diagram comparing the pixel arrangement structure according to the first embodiment of the present invention with an existing embodiment.

It is noted that square pixels in this embodiment have advantages over octagonal pixels. As illustrated in FIG. 15, compared to shapes of a third pixel 31*a* and a second pixel 32*a* being octagonal, and a shape of a first pixel being a square, a distance between the third pixel 31*a* and the first pixel 33 and a distance between the second pixel 32*a* and the first pixel are both a first length Gap. As illustrated in FIG. 15, under the same first length Gap, an embodiment of the present invention increases an area of the third pixel 31 and an area of the second pixel 32 by setting both the third pixel 31 and the second pixel 32 to be square. Corresponding to the OLED display panel, an area of an organic light emitting diode is proportional to its lifetime, so that compared with the embodiment using the octagonal third pixel 31*a* and the octagonal second pixel 32*a*, the pixel arrangement of the first embodiment of the present invention has a longer lifetime without changing the first length.

Figure 16:
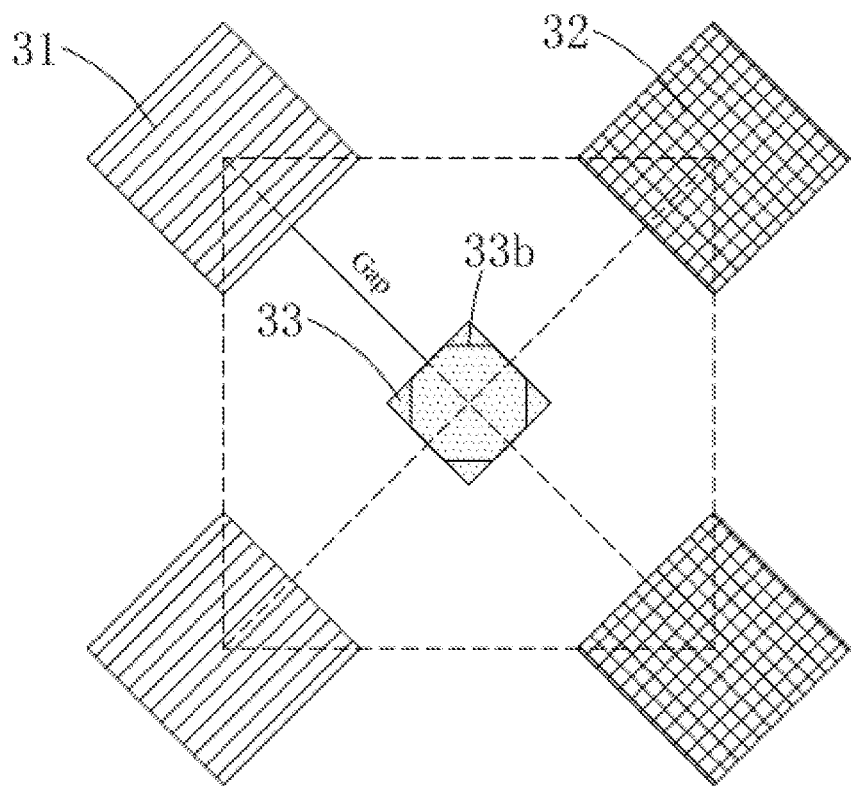
FIG. 16 is a schematic diagram comparing the pixel arrangement structure according to the first embodiment of the present invention with another existing embodiment.

Similarly, referring to FIG. 16, compared with the embodiment where shapes of the third pixel and the second pixel are both square, and the shape of the first pixel 33*b* is octagonal, in an embodiment of the present invention same as the previous embodiment, by setting the shape of the first pixel 33 to be square, the area of the first pixel is increased and lifetime of the OLED display panel is increased without changing the first length GAP.

Figure 12:
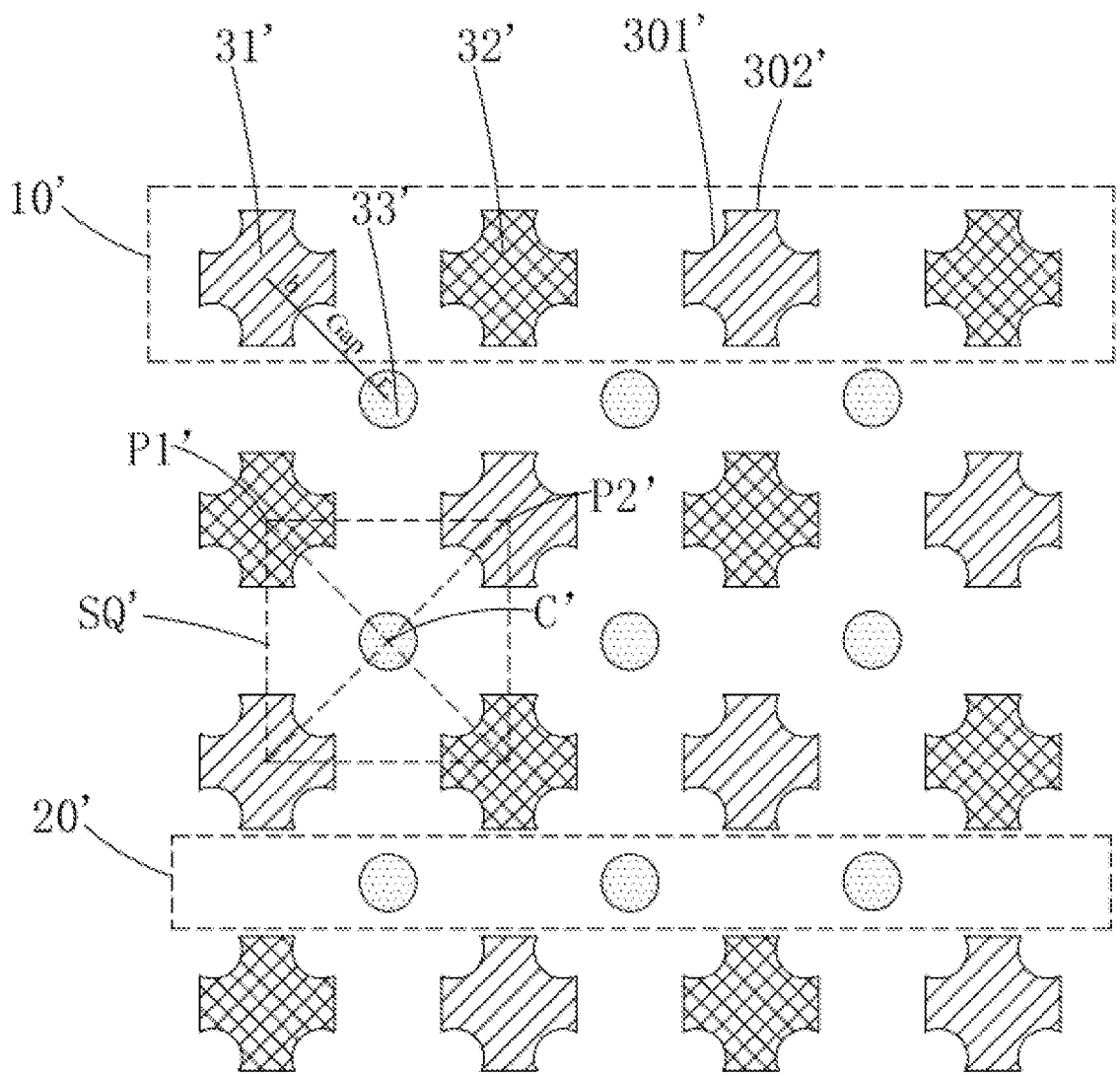
FIG. 12 is a schematic diagram of a pixel arrangement structure according to a second embodiment of the present invention.

Referring to FIG. 12, in a pixel arrangement structure according to a second embodiment of the present invention, the pixel arrangement structure includes a plurality of second pixel rows 10' and a plurality of first pixel rows 20' arranged alternately. Each second pixel row 10' includes a plurality of third pixels 31' and a plurality of second pixels 32' arranged alternately and at intervals, and each first pixel row includes a plurality of first pixels 33' arranged at intervals. Two third pixels 31' and two second pixels 32' adjacent to the first pixel 33' form a virtual box SQ', and the first pixel 33' is arranged in the virtual box SQ' formed by the two third pixels 31' and the two second pixels 32' adjacent thereto, an area of the third pixel 31' is same as an area of the second pixel 32', and the area of the third pixel 31' and the area of the second pixel 32' are greater than an area of the first pixel 33'.

In details, as illustrated in FIG. 12, in the second embodiment, a center of the third pixel 31' coincides with a first vertex P1' of the virtual box SQ', a center of the second pixel 32' coincides with a second vertex P2' adjacent to the first vertex P1' of the virtual box SQ', and a center of the first pixel 33' coincides with a center C' of the virtual box SQ'. A shape of the first pixel 33' is a circle. The third pixel 31' and the second pixel 32' both include four first sides 301' and four second sides 302', and the first sides 301' and the second sides 302' are alternately connected to form a closed figure. The first side 301' is an arc recessed toward an inside of the closed figure, and the second side 302' is a straight line. Therefore, four first sides 301' of each third pixel 31' are respectively opposite to four first pixels 33' adjacent to the third pixel 31', four first sides 301' of each second pixel 32' are respectively opposite to four first pixels 33' adjacent to the second pixel 32'.

It is worth mentioning that, in an ideal state of the second embodiment of the pixel arrangement structure, shapes of the third pixel 31' and the second pixel 32' should be exactly the same, and radii of curvature of four first sides 301' of each third pixel 31' and each second pixel 32' are also the same. In an actual manufacturing process of the second embodiment of the pixel arrangement structure, due to existence of manufacturing errors (for example, manufacturing errors caused by different states of a vapor deposition machine), shapes of the third pixel 31' and the second pixel 32' may be slightly different, and radii of curvature of four first sides 301' of each third pixel 31' and each second pixel 32' may also be slightly deviated, which will not affect the implementation of the present invention.

It should be noted that, in an actual production of FMM, it is difficult to produce square or pointed graphics regardless of etching or laser. In an embodiment of the present invention, the first pixel 33' is set to a circle, and arc-shaped first sides 301' are set in the third pixel 31' and the second pixel 32', which is more in line with the principle of diffusion and can effectively reduce difficulty of making the FFM. In addition, the circular first pixel 33' is the shape with the smallest side length and the highest efficiency in the same area. Due to halo effect of human eyes, a tiny non-circular luminous body will also be regarded as an approximately circular shape. Setting the first pixel 33' as a circular shape can maximize efficiency of the first pixel 33' and meet the halo effect of human eyes. By setting the four first sides 301' of each third pixel 31' to be respectively opposite to four first pixels 33' adjacent to the third pixel 31' and by setting the four first sides 301' of each second pixel 32' to be respectively opposite to the four first pixels 33' adjacent to the second pixel 32', spacing between pixels is maximized.

Preferably, the third pixel 31', the second pixel 32', and the first pixel 33' have different colors and are one of a red pixel, a blue pixel, and a green pixel. In the second embodiment, the third pixel 31', the second pixel 32', and the first pixel 33' emit red light, blue light, and green light respectively. Corresponding to the OLED display panel, that is, the third pixel 31', the second pixel 32', and the first pixel 33' include organic light emitting diodes that emit red light, blue light, and green light, respectively. It is understood that, in other embodiments of the present invention, the third pixel 31', the second pixel 32', and the first pixel 33' may also emit light of other colors.

Figure 17:
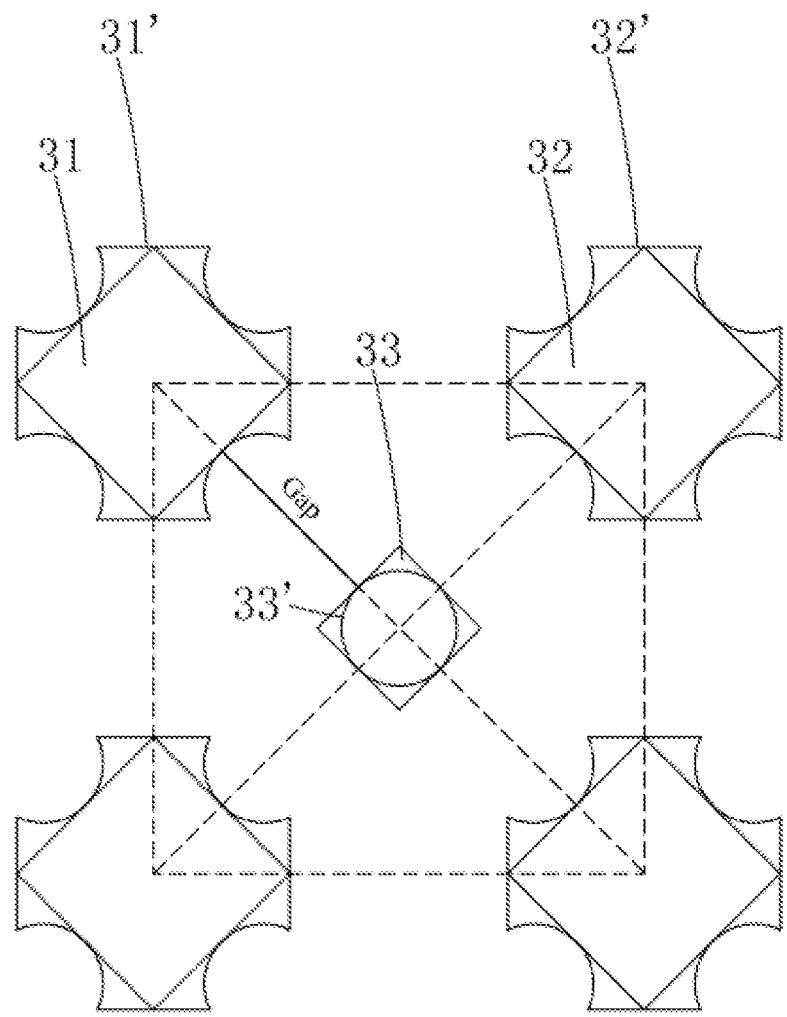
FIG. 17 is a schematic diagram comparing the pixel arrangement structure according to the second embodiment of the present invention with the first embodiment.

Further, as illustrated in FIG. 17, compared with the first embodiment, in the second embodiment, when a distance between the third pixel and the first pixel and a distance between the second pixel and the first pixel, i.e., the first length Gap, are constant, areas of the third pixel 31' and the second pixel 32' are larger, but the area of the first pixel 33' is smaller. In the OLED display panel, lifetime of an organic light emitting diode emitting blue light is the worst, while lifetime of an organic light emitting diode emitting green light is better. The overall lifetime of the OLED display panel depends on the organic light emitting diode with the worst lifetime. In the second embodiment of the present invention, although the area of the first pixel 33' becomes smaller, the first pixel 33' corresponds to an organic light emitting diode that emits green light, and the second pixel 32' corresponds to an organic light emitting diode that emits blue light. In an actual implementation, actual lifetime of the first pixel 33' after the area thereof becomes smaller is still greater than actual lifetime of the second pixel 32' after the area thereof becomes larger. Therefore, the overall lifetime of the OLED display panel still depends on the actual lifetime of the second pixel 32'. The area of the second pixel 32' is larger than that of the first embodiment, so that the overall lifetime of the OLED display panel is larger than that of the first embodiment.

In details, in the second embodiment of the present invention, a distance from the first side of the third pixel 31' to an edge of the first pixel 33' opposite to the first side 301' thereof and a distance from the first side 301' of the second pixel 32' to an edge of the first pixel 33' opposite to the first side 301' thereof are both a first length Gap, a distance from a center of the third pixel 31' to the first side 301' thereof and a distance from a center of the second pixel 32' to the first side 301' thereof are both a second length b, and a radius of the first pixel 33' is a third length r.

During specific implementation, in order to make the actual lifetime of the first pixel 33' after the area thereof becomes smaller still greater than the actual lifetime of the second pixel 32' after the area thereof becomes larger, thereby extending the overall lifetime of the OLED display panel, a pixel density of the pixel arrangement structure preferably ranges from 200 ppi to 600 ppi, the first length Gap preferably ranges from 10 um to 30 um, the second length b preferably ranges from 10 um to 50 um, and the third length r preferably ranges from 4 um to 40 um.

Optionally, in a specific implementation of the second embodiment of the present invention, the first length Gap may be 20 um, the pixel density of the pixel arrangement may be 200 ppi, a sum of the second length b and the third length r may be 40 um, and the second length b may range from 10 um to 30 um.

Optionally, in another specific implementation of the second embodiment of the present invention, the first length Gap may be 20 um, the pixel density of the pixel arrangement structure may be 250 ppi, a sum of the second length b and the third length r may be 28 um, and the second length b may range from 10 um to 21 um.

Optionally, in yet another specific implementation of the second embodiment of the present invention, the first length Gap may be 20 um, the pixel density of the pixel arrangement structure may be 300 ppi, a sum of the second length b and the third length r may be 20 um, and the second length b may range from 10 um to 15 um.

Optionally, in yet another specific implementation of the second embodiment of the present invention, the first length Gap may be 20 um, the pixel density of the pixel arrangement structure may be 350 ppi, a sum of the second length b and the third length r may be 14 um, and the second length b may be 10 um.

Optionally, in yet another specific implementation of the second embodiment of the present invention, the first length Gap may be 15 um, the pixel density of the pixel arrangement structure may be 200 ppi, a sum of the second length b and the third length r may be 45 um, and the second length b may range from 10 um to 33 um.

Optionally, in yet another specific implementation of the second embodiment of the present invention, the first length Gap may be 15 um, the pixel density of the pixel arrangement structure may be 250 ppi, a sum of the second length b and the third length r may be 33 um, and the second length b may range from 10 um to 24 um.

Optionally, in yet another specific implementation of the second embodiment of the present invention, the first length Gap may be 15 um, the pixel density of the pixel arrangement structure may be 300 ppi, a sum of the second length b and the third length may be 25 um, and the second length b may range from 10 um to 18 um.

Optionally, in yet another specific implementation of the second embodiment of the present invention, the first length Gap may be 15 um, the pixel density of the pixel arrangement structure may be 350 ppi, a sum of the second length b and the third length r may be 19 um, and the second length b may range from 10 um to 14 um.

Optionally, in yet another specific implementation of the second embodiment of the present invention, the first length Gap may be 15 um, the pixel density of the pixel arrangement structure may be 400 ppi, a sum of the second length b and the third length r may be 15 um, and the second length b may range from 10 um to 11 um.

Optionally, in yet another specific implementation of the second embodiment of the present invention, the first length Gap may be 25 um, the pixel density of the pixel arrangement structure may be 200 ppi, a sum of the second length b and the third length r may be 35 um, and the second length b may range from 10 um to 26 um.

Optionally, in yet another specific implementation of the second embodiment of the present invention, the first length Gap may be 25 um, the pixel density of the pixel arrangement structure may be 250 ppi, a sum of the second length b and the third length r may be 23 um, and the second length b may range from 10 um to 17 um.

Optionally, in yet another specific implementation of the second embodiment of the present invention, the first length Gap may be 25 um, the pixel density of the pixel arrangement structure may be 300 ppi, a sum of the second length b and the third length r may be 15 um, and the second length b may range from 10 um to 11 um.

Figure 13:
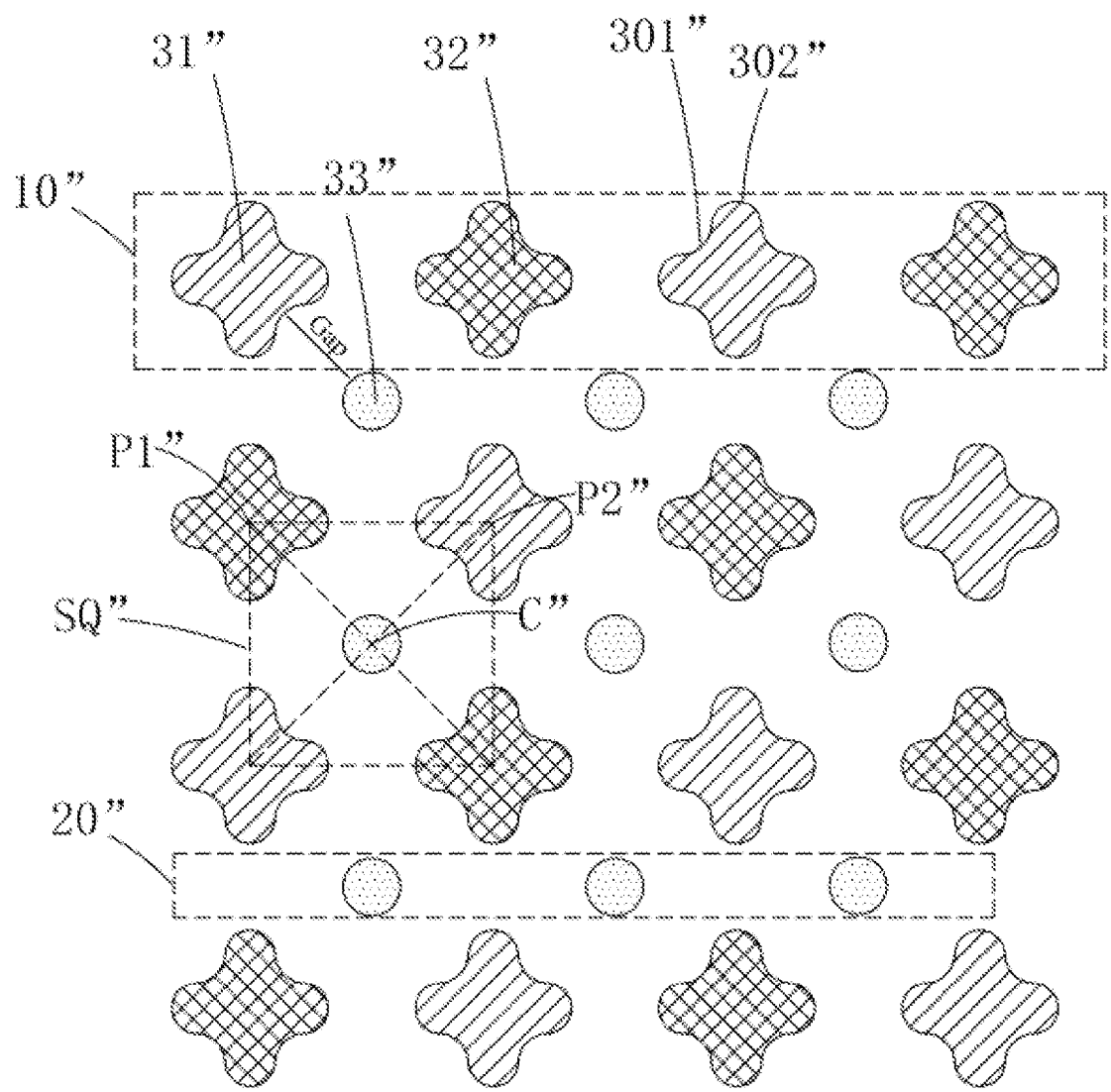
FIG. 13 is a schematic diagram of a first arrangement of a pixel arrangement structure according to a third embodiment of the present invention.
Figure 14:
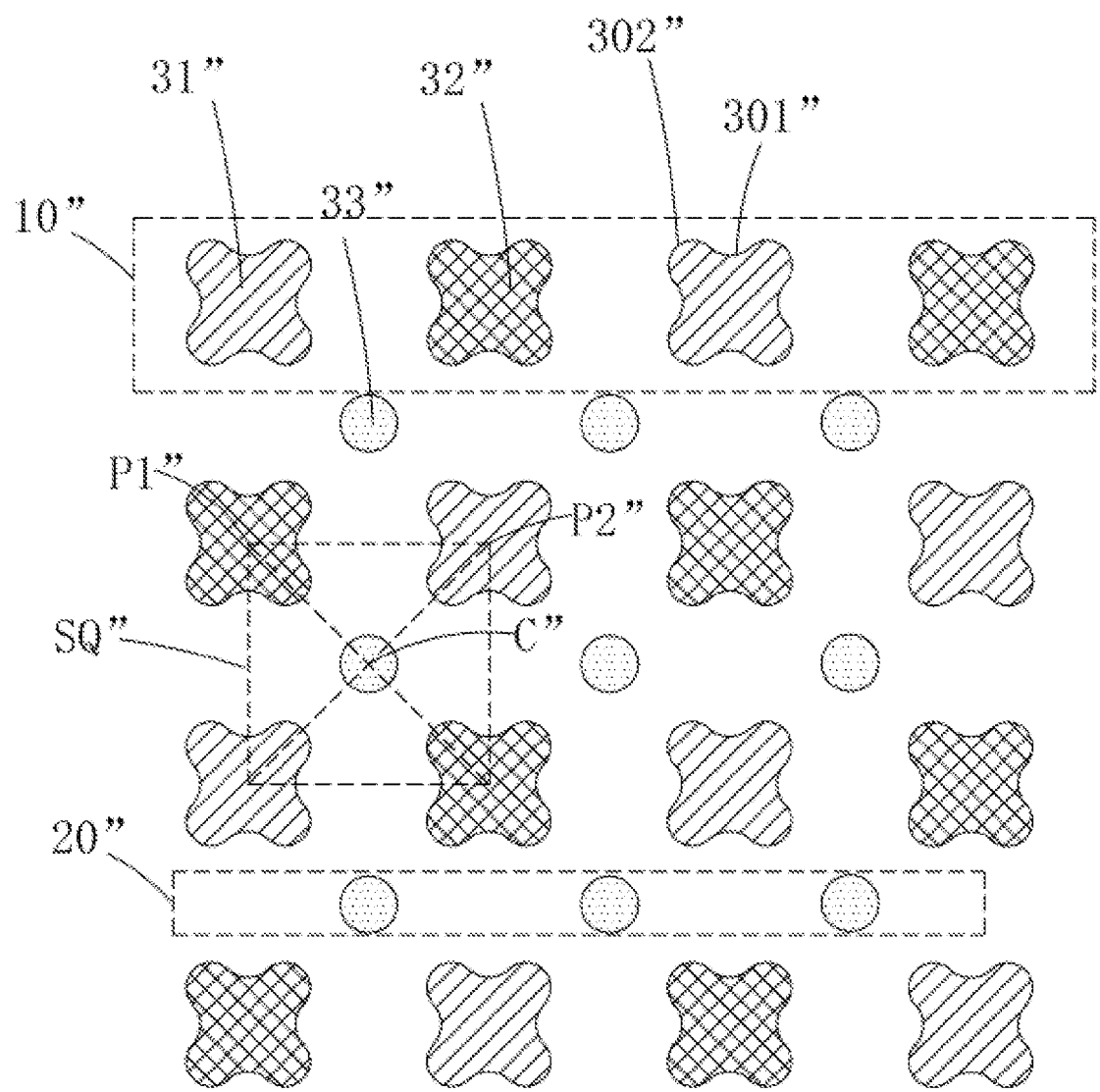
FIG. 14 is a schematic diagram of a second arrangement of the pixel arrangement structure according to the third embodiment of the present invention.

Referring to FIG. 13 and FIG. 14, in a pixel arrangement structure according to a third embodiment of the present invention, the pixel arrangement structure includes a plurality of second pixel rows 10" and a plurality of first pixel rows 20" arranged alternately. Each second pixel row 10" includes a plurality of third pixels 31" and a plurality of second pixels 32" arranged alternately and at intervals, and each first pixel row includes a plurality of first pixels 33" arranged at intervals. Two third pixels 31" and two second pixels 32" adjacent to the first pixel 33" form a virtual box SQ", and the first pixel 33" is arranged in the virtual box SQ" formed by the two third pixels 31" and the two second pixels 32" adjacent thereto, an area of the third pixel 31" is same as an area of the second pixel 32", and the area of the third pixel 31" and the area of the second pixel 32" are greater than an area of the first pixel 33".

In details, as illustrated in FIG. 13 or FIG. 14, in the third embodiment, a center of the third pixel 31" coincides with a first vertex P1" of the virtual box SQ", a center of the second pixel 32" coincides with a second vertex P2" adjacent to the first vertex P1" of the virtual box SQ", and a center of the first pixel 33" coincides with a center C" of the virtual box SQ". A shape of the first pixel 33" is a circle. The third pixel 31" and the second pixel 32" have the same shape and both include four first sides 301" and four second sides 302", and the first sides 301" and the second sides 302" are alternately connected to form a closed figure. The first side 301" is an arc recessed toward an inside of the closed figure, and the second side 302" is an arc protruding toward the inside of the closed figure, that is, the shape of the second side 302" is similar to a bow arm of an arrow.

The specific arrangement, as illustrated in FIG. 13, four first sides 301" of each third pixel 31" can be set to be respectively opposite to four first pixels 33" adjacent to the third pixel 31", four first sides 301" of each second pixel 32" can be set to be respectively opposite to four first pixels 33" adjacent to the second pixel 32". Alternatively, as illustrated in FIG. 14, four second sides 302" of each third pixel 31" are set to be respectively opposite to four first pixels 33" adjacent to the third pixel 31", four second sides 302" of each second pixel 32" are set to be respectively opposite to four first pixels 33" adjacent to the second pixel 32".

It is worth mentioning that, in an ideal state of the third embodiment of the pixel arrangement structure, shapes of the third pixel 31" and the second pixel 32" should be exactly the same, radii of curvature of four first sides 301" of each third pixel 31" and each second pixel 32" are also the same, and radii of curvature of four second sides 302" of each third pixel 31" and each second pixel 32" are also the same. In an actual manufacturing process of the third embodiment of the pixel arrangement structure, due to existence of manufacturing errors (for example, manufacturing errors caused by different states of a vapor deposition machine), shapes of the third pixel 31" and the second pixel 32" may be slightly different, radii of curvature of four first sides 301" of each third pixel 31" and each second pixel 32" may also be slightly deviated, and radii of curvature of four second sides 302" of each third pixel 31" and each second pixel 32" may also be slightly deviated, which will not affect the implementation of the present invention.

It should be noted that, in an actual production of FMM, it is difficult to produce square or pointed graphics regardless of etching or laser. In an embodiment of the present invention, the first pixel 33" is set to a circle, and arc-shaped first sides 301" and arc-shaped second sides 302" are set in the third pixel 31" and the second pixel 32", which is more in line with the principle of diffusion and can effectively reduce difficulty of making the FFM. In addition, the circular first pixel 33" is the shape with the smallest side length and the highest efficiency in the same area. Due to halo effect of human eyes, a tiny non-circular luminous body will also be regarded as an approximately circular shape. Setting the first pixel 33" as a circular shape can maximize efficiency of the first pixel 33" and meet the halo effect of human eyes.

Preferably, the third pixel 31", the second pixel 32", and the first pixel 33" have different colors and are one of a red pixel, a blue pixel, and a green pixel. In the third embodiment, the third pixel 31", the second pixel 32", and the first pixel 33" emit red light, blue light, and green light respectively. Corresponding to the OLED display panel, that is, the third pixel 31", the second pixel 32", and the first pixel 33" include organic light emitting diodes that emit red light, blue light, and green light, respectively. It is understood that, in other embodiments of the present invention, the third pixel 31", the second pixel 32", and the first pixel 33" may also emit light of other colors.

Further, compared with the second embodiment, in the third embodiment, the second side 302" is an arc protruding toward an outside of the closed figure, so that areas of the third pixel 31" and the second pixel 32" are larger and lifetime can be further improved compared with the second embodiment.

Meanwhile, in each embodiment of the present invention, shapes and areas of the third pixel and the second pixel are completely the same, such that in the manufacturing process of the OLED display panel adopting the pixel arrangement structure of the present invention, the third pixel and the second pixel can be manufactured by using the same metal mask. This reduces production costs and enhances product competitiveness.

In summary, an embodiment of the present invention provides a pixel arrangement structure including a plurality of second pixel rows and a plurality of first pixel rows arranged alternately. Each second pixel row includes a plurality of third pixels and a plurality of second pixels arranged alternately and at intervals, and each first pixel row includes a plurality of first pixel s arranged at intervals. Two f third pixels and two second pixels adjacent to the first pixel form a virtual box, and the first pixel is arranged in the virtual box formed by the two third pixels and the two second pixels adjacent to the first pixel, an area of the third pixel is same as an area of the second pixel, and the area of the third pixel and the area of the second pixel are greater than an area of the first pixel. The pixel arrangement structure is applicable in an OLED display panel, which can reduce difficulty of manufacturing the OLED display panel and extend lifetime of the OLED display panel.

In the above, the present disclosure has been disclosed in the above preferred embodiments, but the preferred embodiments are not intended to limit the present disclosure. Various changes and modifications can be made by those skilled in the art without departing from the spirit and scope of the present disclosure. The scope of protection of the present disclosure is therefore defined by the scope of the claims.

What is claimed is:

1. A pixel arrangement structure, comprising:
a plurality of first pixel rows and a plurality of second pixel rows arranged alternately; wherein:
each of the first pixel rows comprises a plurality of first pixels arranged at intervals, and each of the second pixel rows comprises a plurality of second pixels and a plurality of third pixels arranged alternately and at intervals;
a shape of the first pixel comprises a shape formed by an arc;
each of the second pixel and the third pixel comprises a plurality of concave arcs and a plurality of convex arcs, the plurality of concave arcs and the plurality of convex arcs of the second pixel are alternately connected and form a closed figure, and the plurality of concave arcs and the plurality of convex arcs of the third pixel are alternately connected and form a closed figure;
wherein a pixel density of the pixel arrangement structure is 200 ppi;
wherein when the shape of each of the first pixels comprises an ellipse, a long axis of the ellipse points to one of each of the second pixels and each of the third pixels, a short axis of the ellipse points to the other of each of the second pixels and each of the third pixels;
wherein when the shape of the first pixel is the ellipse, the shape of the second pixel and the shape of the third pixel are both shapes that comprises an inner concave arc or a combination of the inner concave arc and an outer convex arc, a curvature of one of at least four inner concave arcs included in the shape of the third pixel is greater than a curvature of one of at least four inner concave arcs included in the shape of the second pixel;
wherein a width of the gap between the first pixel and the second pixel in the third direction is equal to a width of the gap between the first pixel and the third pixel in the fourth direction.

2. The pixel arrangement structure according to claim 1, wherein the first pixel, the second pixel, and the third pixel have different colors.

3. The pixel arrangement structure according to claim 1, wherein the plurality of concave arcs of the second pixel have the same radius of curvature, and/or the plurality of concave arcs of the third pixel have the same radius of curvature.

4. The pixel arrangement structure according to claim 1, wherein the plurality of convex arcs of the second pixel have the same radius of curvature, and/or the plurality of convex arcs of the third pixel have the same radius of curvature.

5. The pixel arrangement structure according to claim 1, wherein a radius of curvature of the plurality of concave arcs of the third pixel is equal to a radius of curvature of the plurality of convex arcs of the third pixel, and/or a radius of curvature of the plurality of concave arcs of the second pixel is equal to a radius of curvature of the plurality of concave arcs of the second pixel.

6. The pixel arrangement structure according to claim 1, wherein the plurality of concave arcs of each of the third pixels are respectively opposite to the four first pixels adjacent to the third pixel, and the plurality of concave arcs of each of the second pixels are respectively opposite to the four first pixels adjacent to the second pixel; or the plurality of convex arcs of each of the third pixels are respectively opposite to the four first pixels adjacent to the third pixel, and the plurality of convex arcs of each of the second pixels are respectively opposite to the four first pixels adjacent to the second pixel.

7. The pixel arrangement structure according to claim 1, wherein a distance from the plurality of concave arcs of the third pixel to an edge of the first pixel opposite to the plurality of concave arcs of the third pixel and a distance from the plurality of concave arcs of the second pixel to an edge of the first pixel opposite to the plurality of concave arcs of the second pixel are both a first length, a distance from a center of the third pixel to the plurality of concave arcs of the third pixel and a distance from a center of the second pixel to the plurality of concave arcs of the second pixel are both a second length, and a radius of the smallest circumscribed circle of the first pixel is a third length;

the first length ranges from 10 um to 30 um, the second length ranges from 10 um to 50 um, and the third length ranges from 4 um to 40 um.

8. The pixel arrangement structure according to claim 1, wherein a center of the first pixel coincides with an end point of a radius of curvature of the plurality of concave arcs of the third pixel, and/or a center of the first pixel coincides with an end point of a radius of curvature of the plurality of concave arcs of the second pixel.

9. The pixel arrangement structure according to claim 1, wherein a center of the first pixel coincides with a center of a circle corresponding to the plurality of concave arcs of the third pixel, and/or a center of the first pixel coincides with a center of a circle corresponding to the plurality of concave arcs of the second pixel.

10. The pixel arrangement structure according to claim 1, wherein the shape of the first pixel is an ellipse.

11. The pixel arrangement structure according to claim 10, wherein the second pixel comprises four concave arcs and four convex arcs, which are alternately connected and form a closed figure, and the third pixel comprises four concave arcs and four convex arcs, which are alternately connected and form a closed figure.

12. The pixel arrangement structure according to claim 1, wherein the second pixels and the third pixels are alternately arranged in at least one of a first direction, a second direction, a third direction, and a fourth direction, the first direction is perpendicular to the second direction, the third direction is a direction having an angle of less than 90 degrees with the first direction, and the fourth direction is perpendicular to the third direction.

13. The pixel arrangement structure according to claim 12, wherein a shape of an edge of one of the second pixels and the third pixels in the third direction or the fourth direction comprises a concave arc, a sum of a radius of curvature of a shape of an edge of the first pixels facing one of the second pixels and the third pixels and a width of a predetermined gap is equal to a radius of curvature of the concave arc included in the edge of one of the second pixels and the third pixels in the third direction or the fourth direction.

14. The pixel arrangement structure according to claim 13, wherein the predetermined gap is a gap between an edge of one of the second pixels and the third pixels and an edge of each adjacent first pixel in one of the third direction and the fourth direction.

15. The pixel arrangement structure according to claim 13, wherein a width of the predetermined gap in the third direction is equal to a width of the predetermined gap in the fourth direction.

16. The pixel arrangement structure according to claim 13, wherein an arc and an extended arc thereof corresponding to an edge of third pixel facing the first pixel and an arc and an extended arc thereof corresponding to an edge of the second pixel facing the first pixel form a predetermined shape; and wherein the predetermined shape comprises a circle or an ellipse.

17. The pixel arrangement structure according to claim 16, wherein a center of a shape of the first pixels is the same as a center of the predetermined shape.

18. The pixel arrangement structure according to claim 13, wherein a radius of curvature of one of the plurality of concave arcs of the third pixel is greater than a radius of curvature of another of the plurality of concave arcs of the third pixel; or a radius of curvature of one of the plurality of concave arcs of the third pixel is greater than or equal to a radius of curvature of one of the plurality of concave arcs of the second pixel.

19. A display panel comprising the pixel arrangement structure according to claim 1.

* * * * *